(12) United States Patent
Tsai et al.

(10) Patent No.: US 10,672,879 B2
(45) Date of Patent: *Jun. 2, 2020

(54) METHOD FOR FORMING FINFET AND GATE-ALL-AROUND FET WITH SELECTIVE HIGH-K OXIDE DEPOSITION

(71) Applicant: Taiwan Semiconductor Manufacturing Co., Ltd., Hsinchu (TW)

(72) Inventors: Tsung-Han Tsai, Kaohsiung (TW); Jen-Hsiang Lu, Taipei (TW); Shih-Hsun Chang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/048,833

(22) Filed: Jul. 30, 2018

(65) Prior Publication Data

US 2020/0035800 A1   Jan. 30, 2020

(51) Int. Cl.
| | |
|---|---|
| *H01L 29/423* | (2006.01) |
| *H01L 29/786* | (2006.01) |
| *H01L 29/66* | (2006.01) |
| *H01L 29/40* | (2006.01) |
| *H01L 21/02* | (2006.01) |
| *H01L 29/78* | (2006.01) |

(52) U.S. Cl.
CPC .. *H01L 29/42392* (2013.01); *H01L 21/02359* (2013.01); *H01L 29/401* (2013.01); *H01L 29/66545* (2013.01); *H01L 29/7851* (2013.01); *H01L 29/78696* (2013.01)

(58) Field of Classification Search
CPC .............. H01L 29/66795; H01L 29/42392
See application file for complete search history.

(56) References Cited

U.S. PATENT DOCUMENTS

| | | | |
|---|---|---|---|
| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |
| 9,171,929 | B2 | 10/2015 | Lee et al. |
| 9,209,247 | B2 | 12/2015 | Colinge et al. |
| 9,214,555 | B2 | 12/2015 | Oxland et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |

(Continued)

*Primary Examiner* — Quoc D Hoang
(74) *Attorney, Agent, or Firm* — Birch, Stewart, Kolasch & Birch, LLP

(57) ABSTRACT

A method of forming a semiconductor device structure is provided. The method includes forming an isolation feature over a semiconductor substrate. The semiconductor substrate includes a fin structure over the isolation feature. Two opposing spacer elements are formed over the isolation feature and across the fin structure so as to define a gate opening. The gate opening exposes the fin structure and the isolation feature and inner sidewalls of the gate opening have carbon-containing hydrophobic surfaces. A gate structure is formed in the gate opening with the carbon-containing hydrophobic surfaces.

20 Claims, 15 Drawing Sheets

(56) References Cited

U.S. PATENT DOCUMENTS

| | | |
|---|---|---|
| 9,536,738 B2 | 1/2017 | Huang et al. |
| 9,548,303 B2 | 1/2017 | Lee et al. |
| 9,576,814 B2 | 2/2017 | Wu et al. |
| 9,608,116 B2 | 3/2017 | Ching et al. |
| 10,038,079 B1 * | 7/2018 | Ohtou ............... H01L 29/66795 |
| 2019/0287966 A1 * | 9/2019 | Guler ................. H01L 29/6681 |

* cited by examiner

METHOD FOR FORMING FINFET AND GATE-ALL-AROUND FET WITH SELECTIVE HIGH-K OXIDE DEPOSITION

BACKGROUND

The semiconductor industry has experienced rapid growth and demands for highly integrated semiconductor devices are increasing. Technological advances in integrated circuit (IC) design and materials have produced generations of ICs. Each generation has smaller and more complex circuits than previous generations.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, challenges from both fabrication and design issues have resulted in the development of three-dimensional designs, such as the fin field effect transistor (FinFET). Advantages of these transistors may include reducing the short channel effect and increasing the current flow.

Although existing FinFETs and methods of fabricating those transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
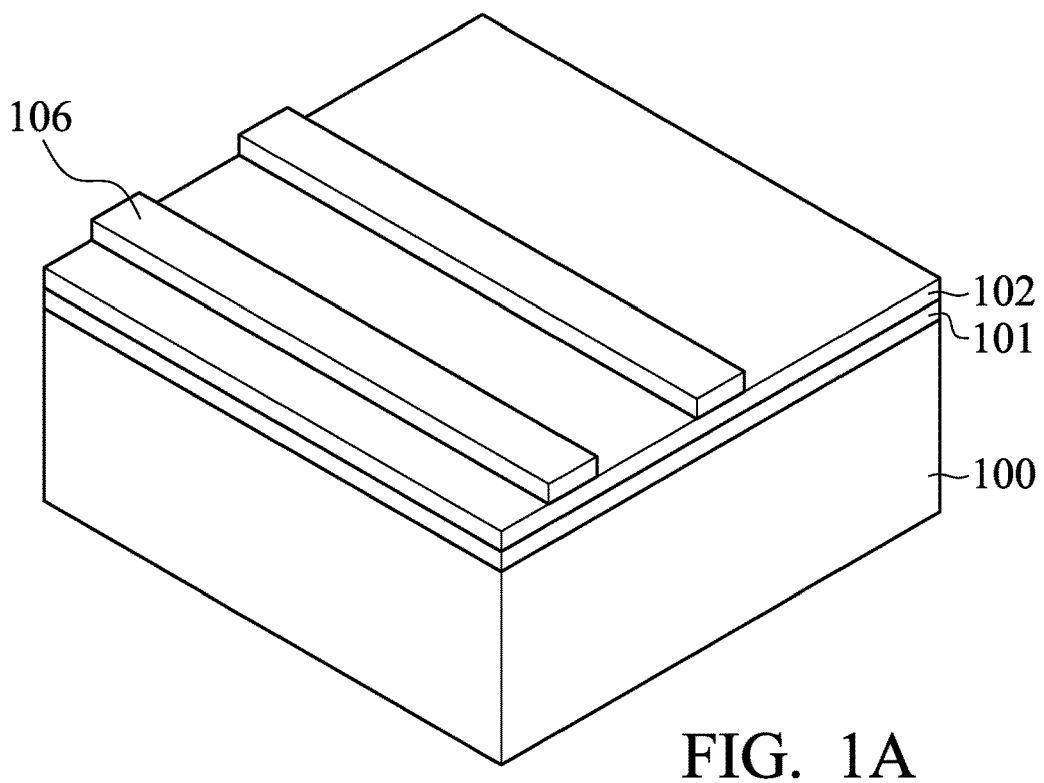
FIGS. 1A to 1L show perspective representations of various stages of forming a FinFET device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs or gate-all-around field effect transistors (GAA FETs). The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of methods of forming a semiconductor device structure are provided. The semiconductor device structure includes a semiconductor substrate having a fin structure and the method of forming a semiconductor device structure includes forming an isolation feature over a semiconductor substrate, in which the fin structure is over the isolation feature. Afterwards, two opposing spacer elements is formed over the isolation feature and across the fin structure so as to define a gate opening that exposes the fin structure and the isolation feature. The inner sidewalls of the gate opening is treated with a plasma or the spacer elements are formed by using a carbon-containing process gas, so that the inner sidewalls of the gate opening have hydrophobic surfaces. Afterwards, a gate dielectric layer and a gate electrode layer are successively formed in the gate opening. During the gate dielectric layer is formed, the hydrophobic surfaces of gate opening obstruct or slow down the deposition of the gate dielectric layer thereon. As a result, the area between the spacer elements, which is a gate-filling window, is increased. Therefore, the gate-filling window is enlarged, so as to facilitate the gap-filling process to form the gate electrode layer into the gate opening.

Embodiments of a semiconductor device structure and a method of forming a semiconductor device structure are provided. FIGS. 1A to 1L show perspective representations of various stages of forming a fin field effect transistor (FinFET) structure, in accordance with some embodiments of the disclosure. A substrate 100 is provided, as shown in FIG. 1A in accordance with some embodiments. In some embodiments, the substrate 100 is a semiconductor substrate, such as a bulk semiconductor (such as a semiconductor wafer), a semiconductor-on-insulator (SOI) substrate, or the like, which may be doped (e.g. with a P-type or an N-type dopant) or undoped. The SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. The SOI substrate may be fabricated using a wafer bonding process, a silicon film transfer process, a separation by implantation of oxygen (SIMOX) process, another applicable method, or a combination thereof.

In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

In some embodiments, a mask structure is formed over the substrate 100. A first masking layer 101 and a second masking layer 102 of the mask structure are successively stacked over the substrate 100 for the subsequent patterning process, in accordance with some embodiments. In some examples, the first masking layer 101 may be used as an etch stop layer when the second masking layer 102 is patterned. The first masking layer 101 may also be used as an adhesion layer that is formed between the substrate 100 and the second masking layer 102.

In some embodiments, the first masking layer 101 is made of silicon oxide and is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the second masking layer 102 is made of silicon oxide, silicon nitride, silicon oxynitride, or another applicable material. In some other embodiments, more than one second masking layer 102 is formed over the first masking layer 101. In some embodiments, the second masking layer 102 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After formation of the first masking layer 101 and the second masking layer 102 of the mask structure, a patterned photoresist layer 106 may be formed over the second masking layer 102 for subsequent definition of one or more fin structures in the substrate 100. In some embodiments, the patterned photoresist layer 106 is formed by a photolithography process. The photolithography process may include photoresist coating (e.g., spin-on coating), soft baking, mask aligning, exposure, post-exposure baking, developing the photoresist, rinsing and drying (e.g., hard baking).

Figure 1B:
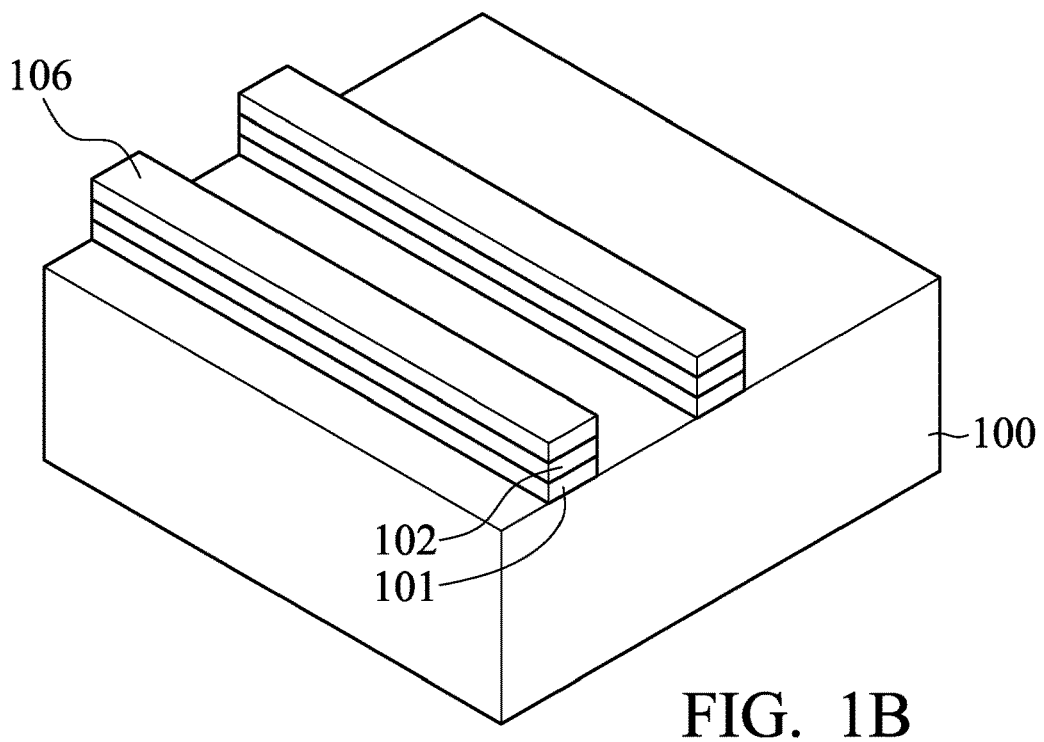

The first masking layer 101 and the second masking layer 102 of the mask structure are patterned by using the patterned photoresist layer 106 as an etch mask, as shown in FIG. 1B in accordance with some embodiments. After the first masking layer 101 and the overlying second masking layer 102 are etched, a patterned first masking layer 101 and a patterned second masking layer 102 are formed, so that portions of the underlying substrate 100 are exposed.

Figure 1C:
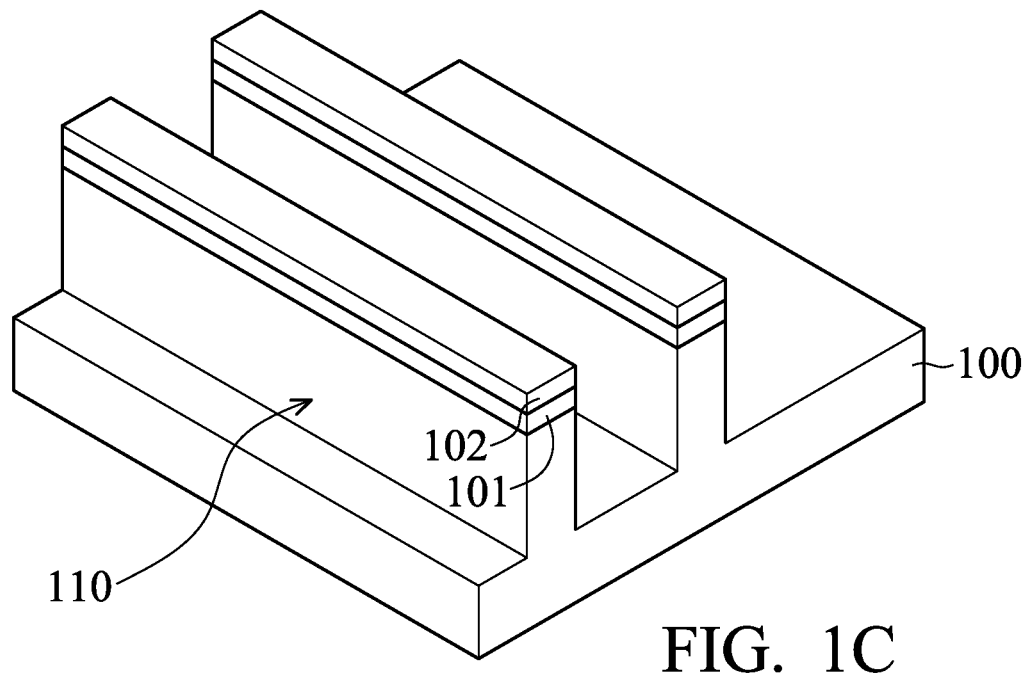

After the portions of the substrate 100 are exposed by forming the patterned first masking layer 101 and the patterned second masking layer 102, the patterned photoresist layer 106 is removed, as shown in FIG. 1C in accordance with some embodiments. Afterwards, the exposed portions of the substrate 100 are partially removed by an etching process using the patterned second masking layer 102 and the patterned first masking layer 101 as an etch mask. As a result, fin structures and trenches in the substrate 100 are formed. In order to simplify the diagram, two fin structures 110 protruding from the substrate 100 are depicted as an example.

In some embodiments, the etching process for formation of fin structures 110 is a dry etching process or a wet etching process. For example, the substrate 100 is etched by a dry etching process, such as a reactive ion etching (RIE), neutral beam etching (NBE), the like, or a combination thereof. The etching process may be a time-controlled process, and continue until the fin structures 110 are formed and reach a predetermined height. A person of ordinary skill in the art will readily understand other methods of forming the fin structures, which are contemplated within the scope of some embodiments.

Figure 1D:
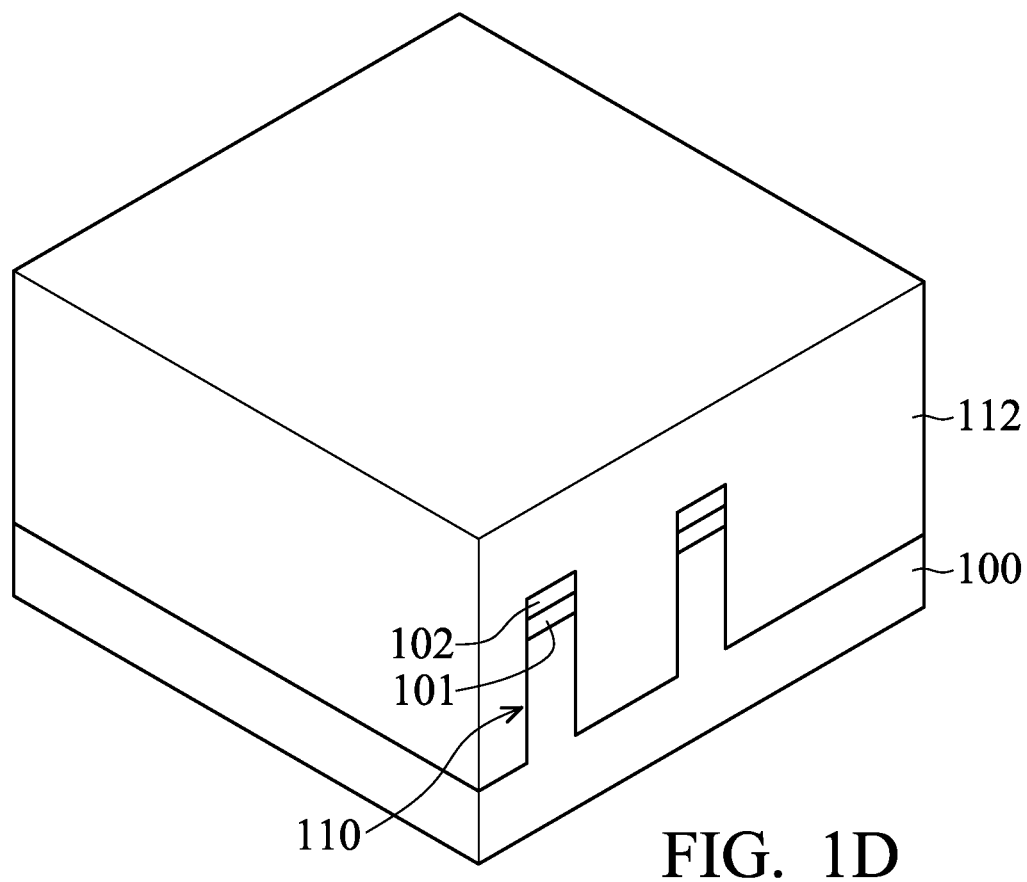

Afterwards, an insulating layer 112 is formed over the substrate 100 to cover the fin structures 110, as shown in FIG. 1D in accordance with some embodiments. In some embodiments, the insulating layer 112 is made of silicon oxide, fluoride-doped silicate glass (FSG), a low-k dielectric material, and/or another suitable dielectric material or another low-k dielectric material. The insulating layer 112 may be deposited by a chemical vapor deposition (CVD) process, a flowable CVD (FCVD) process, a spin-on-glass process, or another applicable process.

In some other embodiments, before the insulating layer 112 is formed, one or more insulating liners (not shown) are formed on the sidewalls of the fin structures 110 and the bottom of the trenches in the substrate 100. The insulating liner(s) may be formed of silicon oxide, silicon nitride, silicon oxynitride, silicon carbide (SiC), or a combination thereof. The liner(s) may be deposited by a chemical vapor deposition (CVD) process or another applicable process.

Afterwards, the insulating layer 112 is recessed to expose the top surface of the patterned second masking layer 102, in accordance with some embodiments. For example, the insulating layer 112 over the top surface of the patterned second masking layer 102 is etched back or removed by a chemical mechanical polishing (CMP) process. After the top surface of the patterned second masking layer 102 is exposed, the patterned second masking layer 102 and the patterned first masking layer 101 are removed by one or more etching processes, so as to expose the top surfaces of the fin structures 110. For example, the patterned second masking layer 102 and the patterned first masking layer 101 are removed by a dry etching process, a wet etching process, or a combination thereof.

Figure 1E:
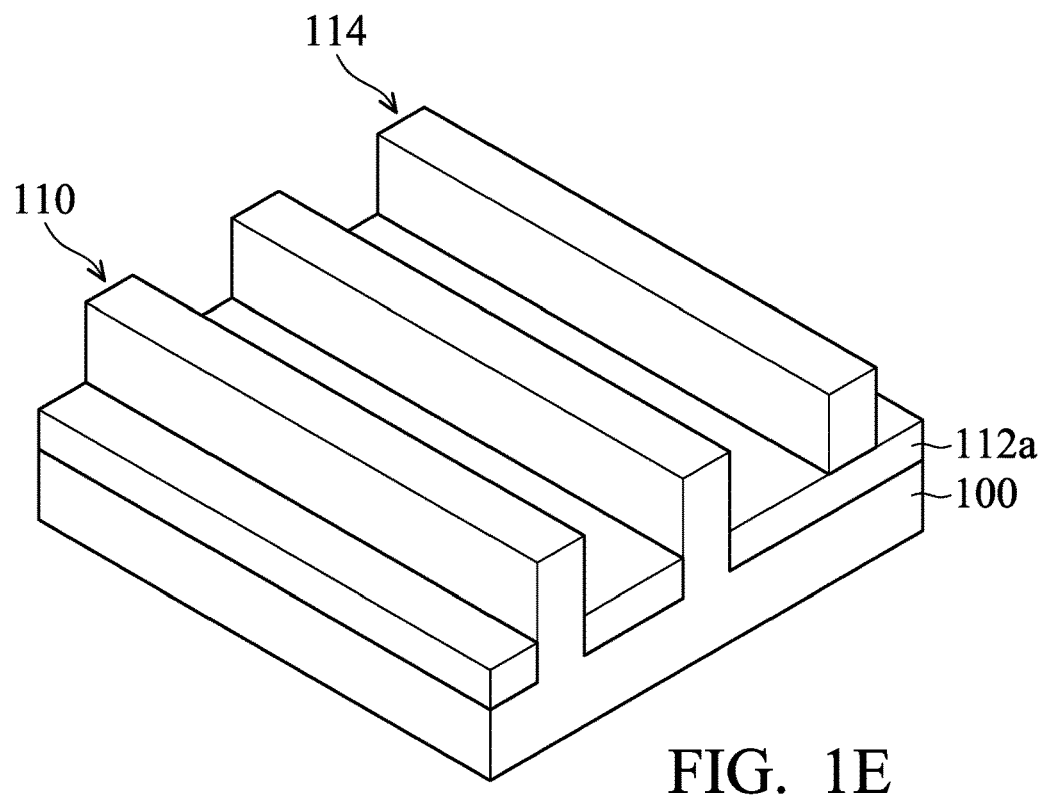

Afterwards, the exposed insulating layer 112 is further recessed to form isolation features 112a, as shown in FIG. 1E in accordance with some embodiments. In some embodiments, the isolation feature 112a includes the remaining insulating layer 112 and the insulating liner(s) (not shown) surrounding the remaining insulating layer 112. The isolation features 112a may be shallow trench isolation (STI) structures surrounding the fin structures 110, so as to prevent electrical interference or crosstalk. A portion of the fin structure 110 is embedded in the isolation features 112a, so that the lower portion of each fin structure 110 is surrounded by the isolation features 112a and the upper portion of each fin structure 110 protrudes from the isolation features 112a.

After formation of the isolation features 112a, an insulating layer 114 is formed over the isolation features 112a, as shown in FIG. 1E, in accordance with some embodiments. The insulating layer 114 has a strip shape that is similar to the shape of the fin structure 110 and therefore the insulating layer 114 may be referred to as a dummy fin structure. The insulating layer 114 is spaced apart from the fin structures 110 and extends along a direction that is substantially parallel to the extending direction of the fin structures 110.

In some embodiments, the insulating layer 114 serves as a portion of an insulating gate-cut structure and is made of a nitride-based material, such as silicon nitride, silicon oxynitride, or silicon carbon nitride, or the like. In some embodiments, the insulating layer 114 is made of a high-k dielectric material such as metal oxide in accordance with some embodiments. Examples of high-k dielectric materials include hafnium oxide ($HfO_2$), hafnium silicon oxide (HfSiO), hafnium tantalum oxide (HMO), hafnium titanium oxide (HfTiO), hafnium zirconium oxide (HfZrO), zirconium oxide, titanium oxide, aluminum oxide, or other applicable dielectric materials. In some embodiments, the insulating layer 114 is formed by chemical vapor deposition (CVD), physical vapor deposition, (PVD), or another applicable process.

Figure 1F:
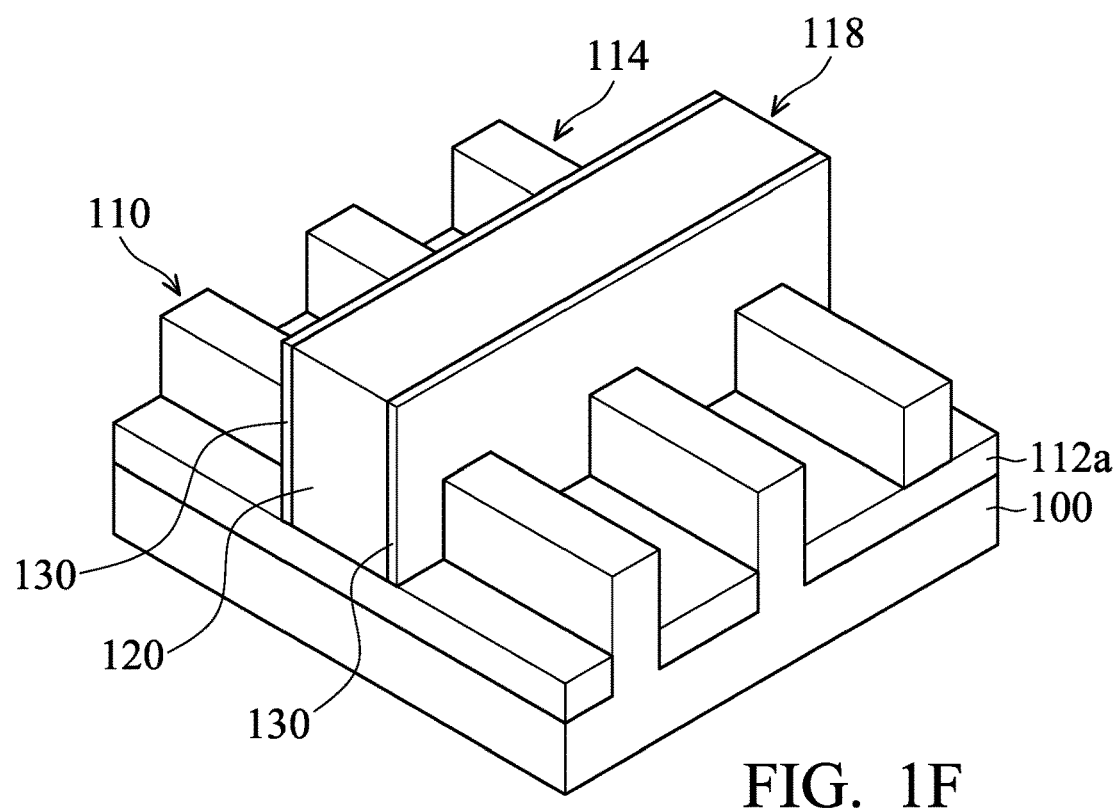

Afterwards, a dummy gate structure 118 is formed over the isolation features 112a and across the fin structures 110 and the insulating layer 114 (i.e., the dummy fin structure), as shown in FIG. 1F in accordance with some embodiments. In some embodiments, the dummy gate structure 118 includes an optional dummy gate dielectric layer (not shown) and a dummy gate electrode layer 120 over the dummy gate dielectric layer. The dummy gate dielectric layer is made of a high-k dielectric material such as metal oxide in accordance with some embodiments. Examples of high-k dielectric materials include hafnium oxide ($HfO_2$), hafnium silicon oxide (HfSiO), hafnium tantalum oxide (HMO), hafnium titanium oxide (HfTiO), hafnium zirconium oxide (HfZrO), zirconium oxide, titanium oxide, aluminum oxide, or other applicable dielectric materials. In some embodiments, the dummy gate dielectric layer is formed by chemical vapor deposition (CVD), physical vapor deposition, (PVD), atomic layer deposition (ALD), or other applicable processes.

After the dummy gate dielectric layer is formed, the dummy gate electrode layer 120 is formed over dummy gate dielectric layer. In some embodiments, the dummy gate electrode layer 120 is made of polysilicon. Afterwards, the dummy gate dielectric layer and the dummy gate electrode layer 120 are patterned to form the dummy gate structure 118 over and across the fin structures 110, in accordance with some embodiments.

After the dummy gate structure 118 is formed, two opposing spacer elements 130 (which are sometimes referred to as gate spacers) are formed over opposite sidewall surfaces of the dummy gate structure 118. The spacer elements 130 may be a single layer or multiple layers. In some embodiments, the spacer elements 130 are formed of a hydrophilic material, such as silicon nitride, silicon oxide, silicon carbide, silicon oxynitride, or other applicable materials. In some embodiments, the spacer elements 130 are formed by chemical vapor deposition (CVD), physical vapor deposition, (PVD), atomic layer deposition (ALD), or other applicable processes.

Figure 1G:
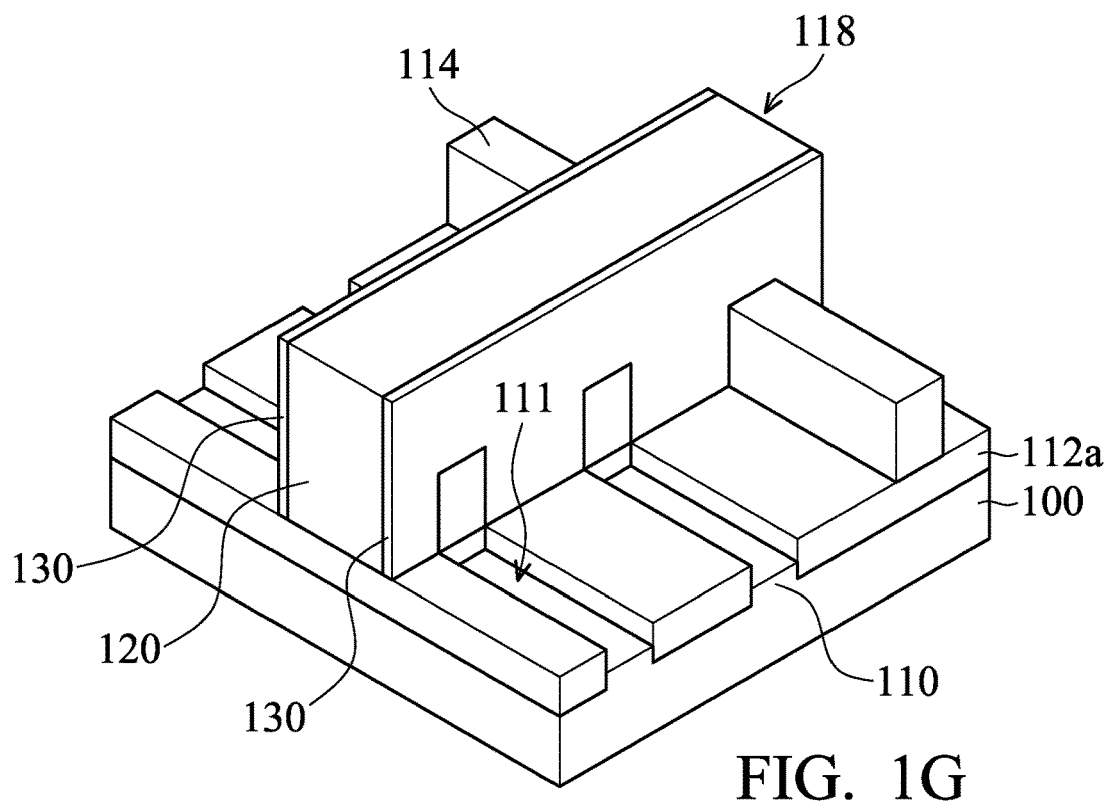

Openings 111 are formed in each fin structure 110 and on opposing sidewall surfaces of the dummy gate structure 118 by a fin recess process after the spacer elements 130 are formed, as shown in FIG. 1G in accordance with some embodiments. In some embodiments, the fin recess process is a dry etching process or a wet etching process. The bottom surfaces of the formed openings 111 are lower than the top surfaces of the isolation features 124.

Figure 1H:
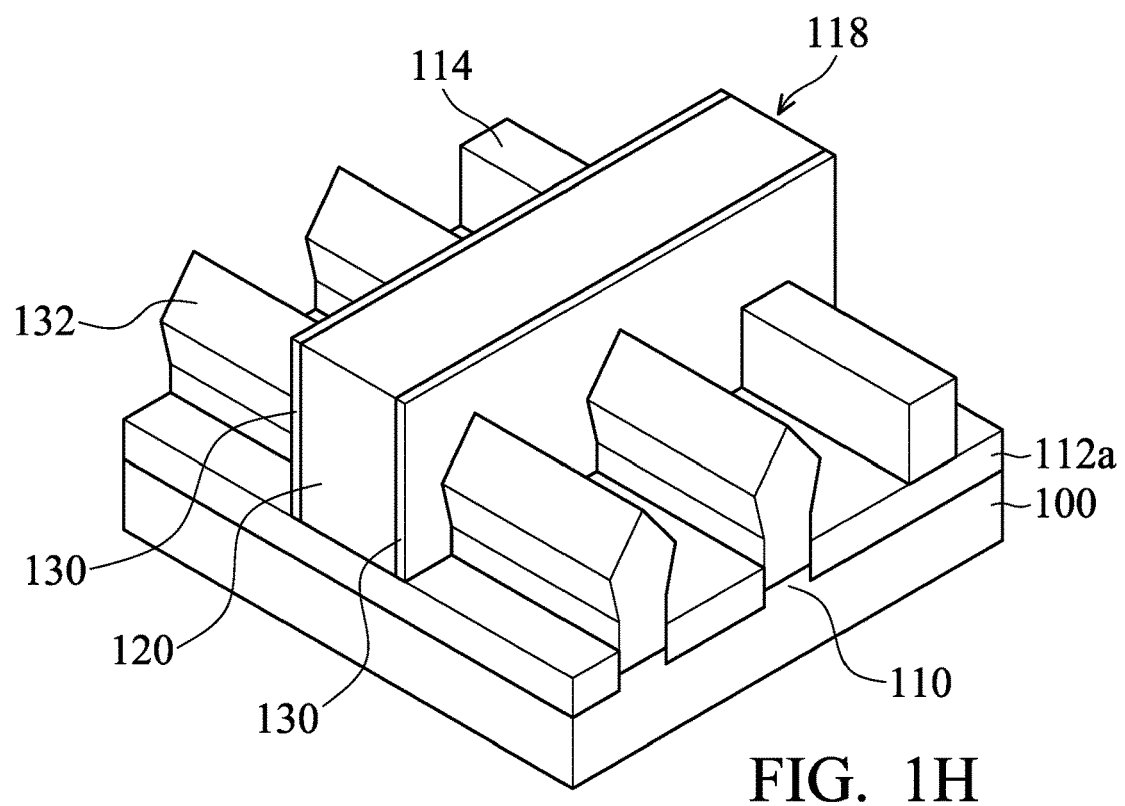

Afterwards, source and drain features 132 is formed in the openings 111 (indicated by FIG. 1G) of each fin structure 110 and protrudes from the openings 111, as shown in FIG. 1H in accordance with some embodiments. In some embodiments, portions of the fin structure 110 adjacent to the dummy gate structure 118 are recessed to form openings 111, and a strained material is grown in each opening 111 of the fin structure 110 by an epitaxial process to form the source and drain features 132. The source and drain features 132 are formed over the fin structure 110 on opposing sidewall surfaces of the dummy gate structure 118. In some embodiments, the lattice constant of the strained material may be different from the lattice constant of the substrate 100. In some embodiments, the source and drain features 132 include Ge, SiGe, InAs, InGaAs, InSb, GaAs, GaSb, InAlP, InP, or the like.

After the source and drain features 132 are formed, an insulating layer 136 (e.g., an inter-layer dielectric (ILD) layer) is formed over the substrate 100 and covers the source and drain features 132 and the dummy gate structure 118, in accordance with some embodiments. In some embodiments, the insulating layer 136 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric material include, fluorinated silica glass (FSG), carbon doped silicon oxide, amorphous fluorinated carbon, parylene, bis-benzocyclobutenes (BCB), or polyimide. In some embodiments, the insulating layer 136 is formed by chemical vapor deposition (CVD), physical vapor deposition, (PVD), atomic layer deposition (ALD), spin-on coating, or another applicable process.

In some other embodiments, a contact etch stop layer (not shown) is formed between the substrate 100 and the insulating layer 136. The contact etch stop layer is made of silicon nitride, silicon oxynitride, and/or other applicable materials, in accordance with some embodiments. The contact etch stop layer may be formed by plasma enhanced chemical vapor deposition (PECVD), low-pressure chemical vapor deposition (LPCVD), atomic layer deposition (ALD), or other applicable processes.

Figure 1I:
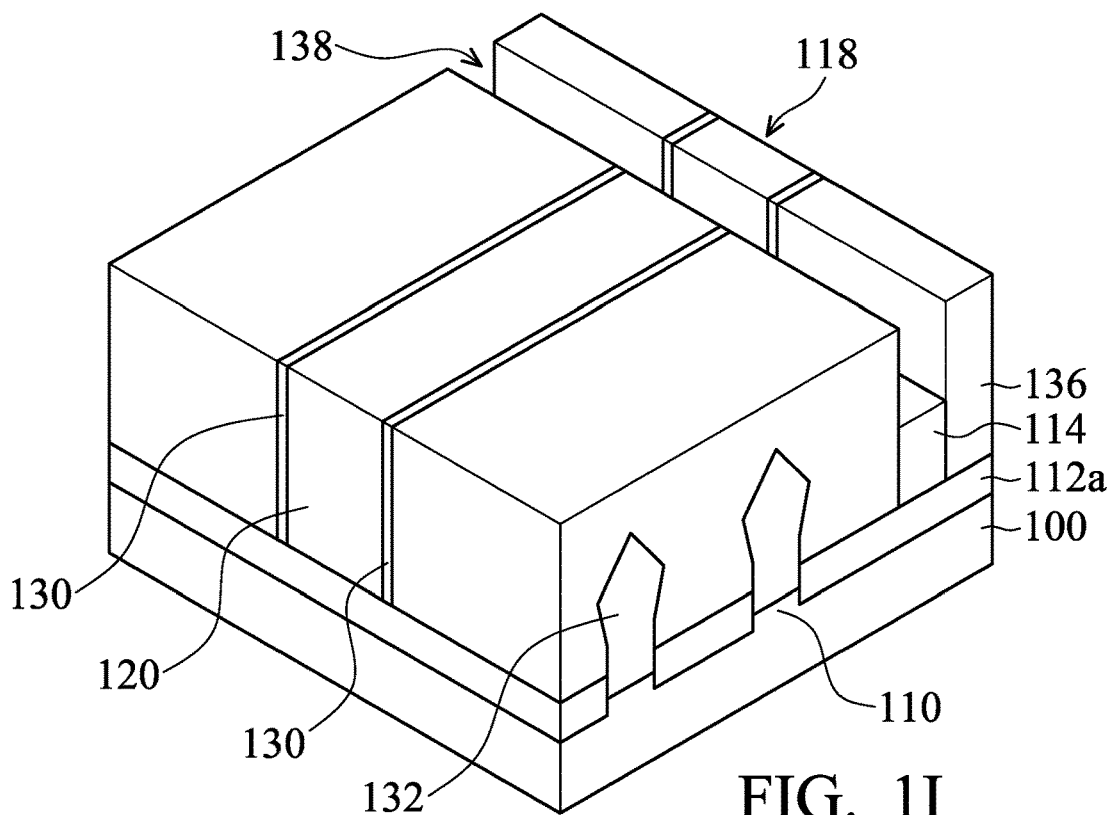

Afterwards, a planarization process is performed on the insulating layer 136 until the top surface of the dummy gate structure 118 is exposed, as shown in FIG. 1I in accordance with some embodiments. In some embodiments, the insulating layer 136 is planarized by a polishing process, such as a chemical mechanical polishing (CMP) process.

Afterwards, a cut opening 138 is formed to cut the dummy gate structure 118, as shown in FIG. 1I in accordance with some embodiments. The cut opening 138 is formed by removing portions of the dummy gate structure 118, the spacer elements 130, and the insulating layer 136 above the insulating layer 114 (i.e., the dummy fin structure), so that the insulating layer 114 is exposed through the cut opening 138. The cut opening 138 extends along the extending direction of the insulating layer 114 and substantially aligns the insulating layer 114.

In some embodiments, the cut opening 138 has a width that is substantially equal to the width of the insulating layer 114. In some embodiments, the portions of the dummy gate structure 118, the spacer elements 130, and the insulating layer 136 above the insulating layer 114 are removed using one or more photolithography processes and one or more etch processes. In some embodiments, the etch process includes a dry etching process or a wet etching process.

Figure 1J:
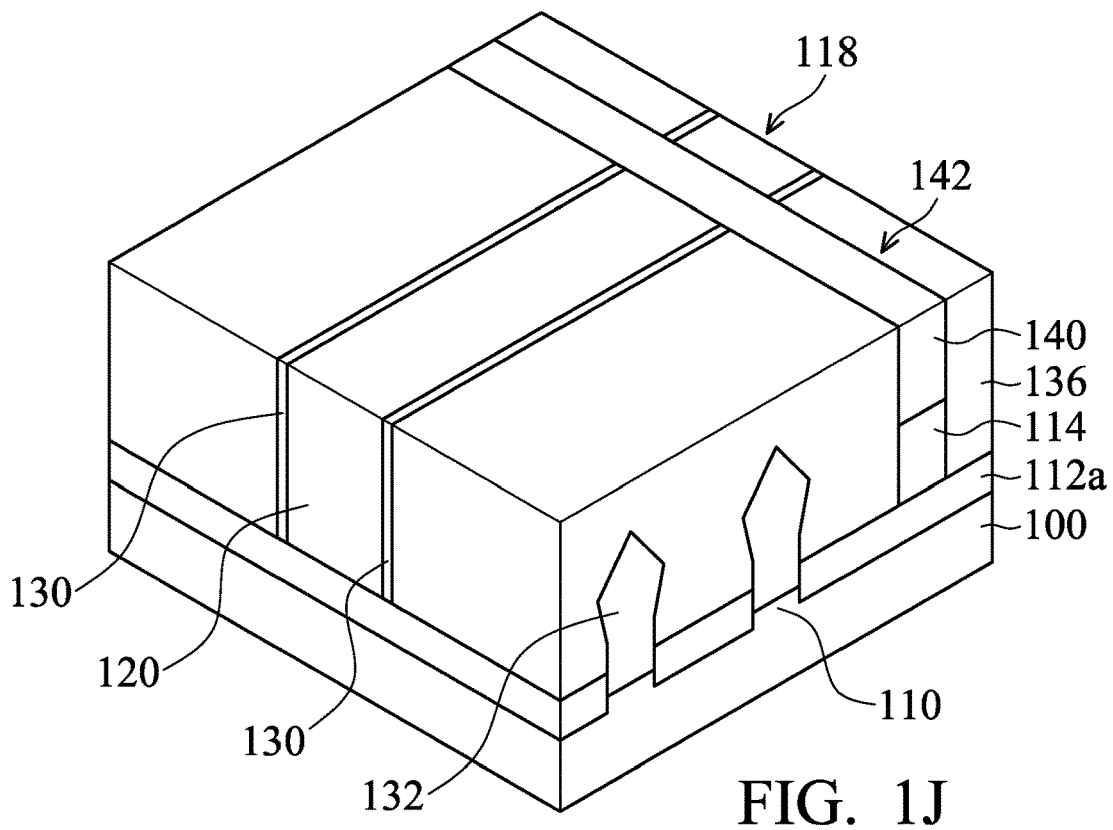

After the cut opening 138 is formed, an insulating gate-cut structure 142 is formed over the isolation feature 112a, as shown in FIG. 1J in accordance with some embodiments. In some embodiments, the cut opening 138 is filled with an insulating layer 140, so that the insulating layer 114 is between the isolation feature 112a and the insulating layer 140. In some embodiments, the insulating layer 140 also has a width that is substantially equal to the width of the insulating layer 114. The stack of the insulating layer 140 and the insulating layer 114 forms the insulating gate-cut structure 142 and is spaced apart from the fin structures 110. In some embodiments, the insulating layer 140 has a top surface substantially level with top surfaces of the dummy gate structure 118, the spacer elements 130, and the insulating layer 136.

In some embodiments, the insulating layer 140 is made of a nitride-based material, such as silicon nitride, silicon oxynitride, or silicon carbon nitride, or the like. In some embodiments, the insulating layer 140 is made of a high-k dielectric material such as hafnium oxide ($HfO_2$), hafnium silicon oxide (HfSiO), hafnium tantalum oxide (HMO), hafnium titanium oxide (HfTiO), hafnium zirconium oxide (HfZrO), zirconium oxide, titanium oxide, aluminum oxide, or other applicable dielectric materials. In some embodiments, the insulating layer 140 is formed by chemical vapor deposition (CVD), physical vapor deposition, (PVD), or another applicable process.

Figure 1K:
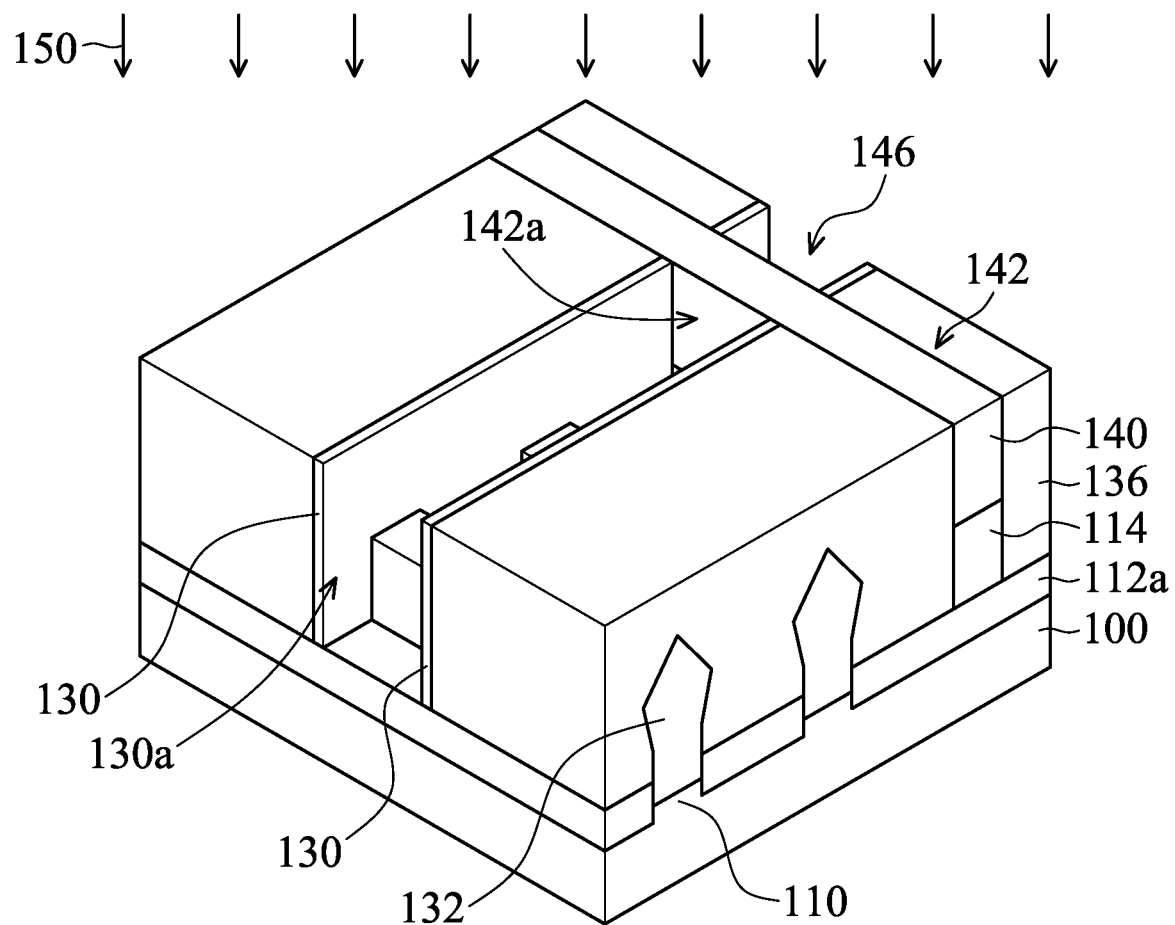

After the insulating gate-cut structure 142 is formed, the dummy gate structure 118 is removed to form an opening 146 (which is sometimes referred to as a gate opening) in the insulating layer 136, as shown in FIG. 1K in accordance with some embodiments. The dummy gate dielectric layer and the dummy gate electrode layer 120 of the dummy gate structure 118 are removed by an etching process, such as a dry etching process or a wet etching process. After the dummy gate structure 118 is removed, the gate opening (i.e., the opening 146) is defined by the two opposing spacer elements 130. A portion of the insulating gate-cut structure 142 is formed in the opening 146 to divide the opening 146 into two parts. Moreover, a portion of each fin structure 110 and a portion of the isolation feature 112a in the opening 146 are exposed.

Afterwards, a surface treatment 150 is performed on the inner sidewalls of the gate opening (i.e., the opening 146), as shown in FIG. 1K in accordance with some embodiments. While the surface treatment 150 being performed, the inner sidewalls 130a of the spacer elements 130 and the two opposing sidewalls 142a of the insulating gate-cut structure 142 are simultaneously treated by the surface treatment 150. As a result, those sidewalls 130a and 142a have hydrophobic surfaces.

In some embodiments, the surface treatment 150 is a plasma treatment and the plasma that is employed to treat the inner sidewalls of the gate opening that is formed using a carbon-containing process gas. Therefore, the surface treatment 150 is also referred to as a carbon-containing plasma treatment and the sidewalls 130a and 142a have carbon-containing hydrophobic surfaces. In some embodiments, those carbon-containing hydrophobic surfaces have a carbon concentration in a range from about 5% to about 20%. A sufficient carbon concentration on the surfaces of the sidewalls 130a and 142a can obstruct or slow down the deposition of high-k dielectric material thereon.

In some embodiments, the surface treatment 150 is performed using $CH_4$ and $N_2$ as the process gases. For example, the flow rate of $CH_4$ is in a range from about 500 sccm to about 2000 sccm and the flow rate of $N_2$ is in a range from about 3500 sccm to about 5000 sccm. Moreover, the surface treatment 150 is performed using power in a range from about 1800 W to about 3000 W at a temperature in a range from about 150° C. to about 200° C. and at a pressure in a range from about 300 mtorr to about 1500 mtorr.

In some other embodiments, the spacer elements 130 and the insulating gate-cut structure 142 (i.e., the insulating layers 114 and 140) are made of the same or similar material. In some embodiments, the spacer elements 130 are deposited by using a carbon-containing process gas, so that the sidewalls 130a have carbon-containing hydrophobic surfaces without performing the surface treatment 150. Therefore, after the dummy gate structure 118 is removed, the surface treatment 150 may be omitted. In those cases, the depositions of the spacer elements 130 and the insulating gate-cut structure 142 are performed using $C_3H_6$, $Si_2Cl_6$ (hexachloro disilane, HCD), $O_2$ and $N_2$ as the process gases. For example, the flow rate of $C_3H_6$ is in a range from about 0.1 slm to about 30 slm, the flow rate of HCD is in a range from about 0.1 slm to about 20 slm, the flow rate of $O_2$ is in a range from about 0.1 slm to about 15 slm, and the flow rate of $N_2$ is in a range from about 1 slm to about 20 slm. Moreover, those depositions are performed at a temperature in a range from about 400° C. to about 700° C. and at a pressure in a range from about 50 pa to about 2000 pa.

Figure 1L:
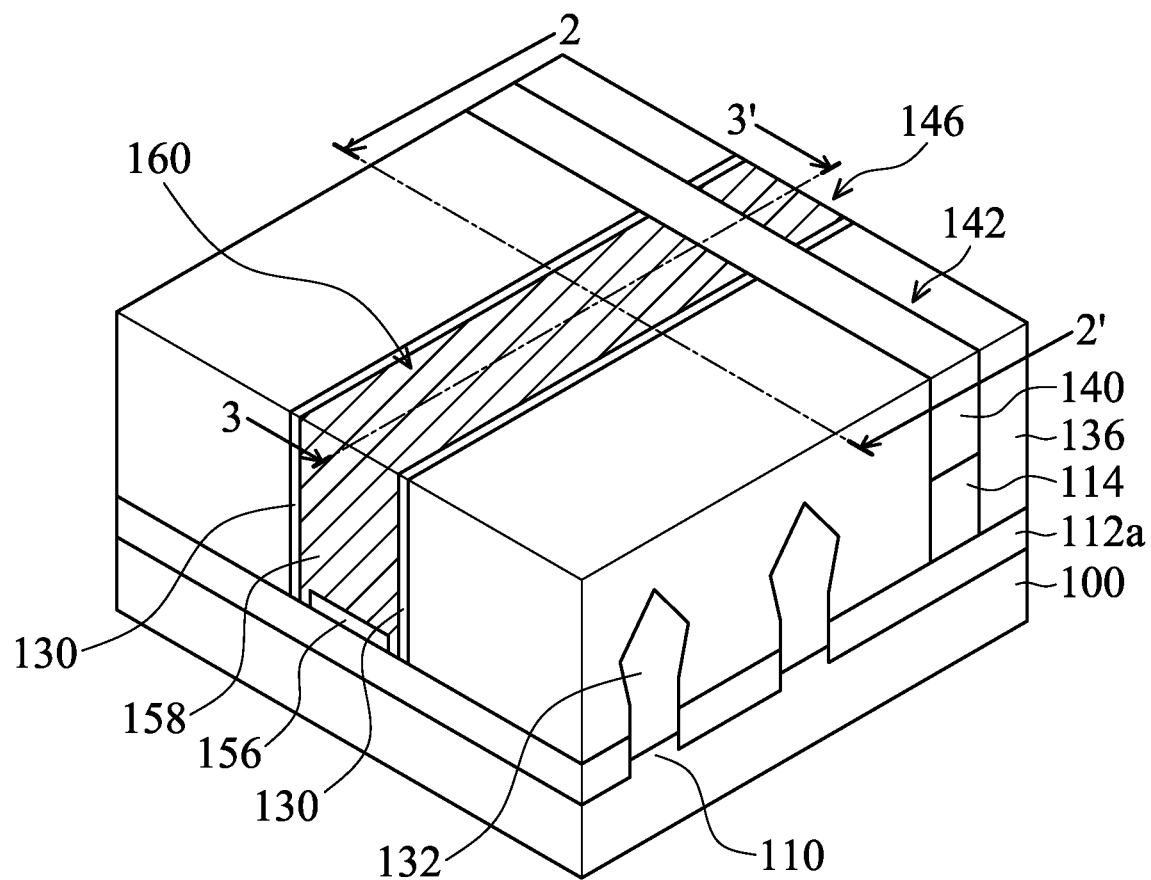
Figure 2:
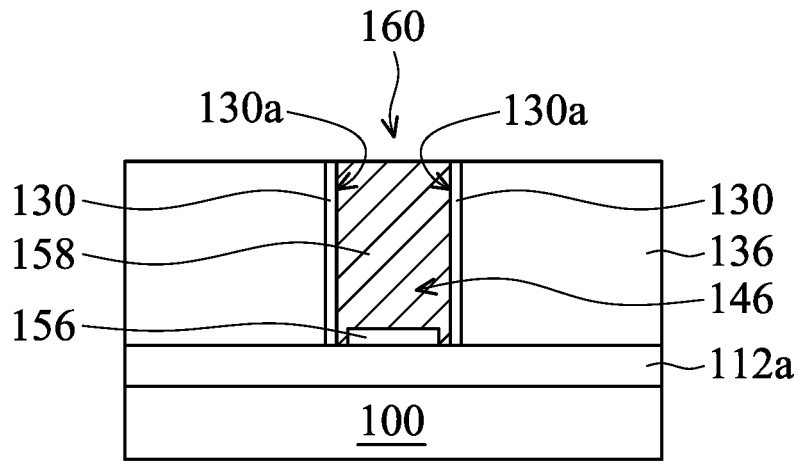
FIG. 2 is a schematic cross-sectional view showing various stages of the FinFET device structure taken along the line 2-2' in FIG. 1L.
Figure 3:
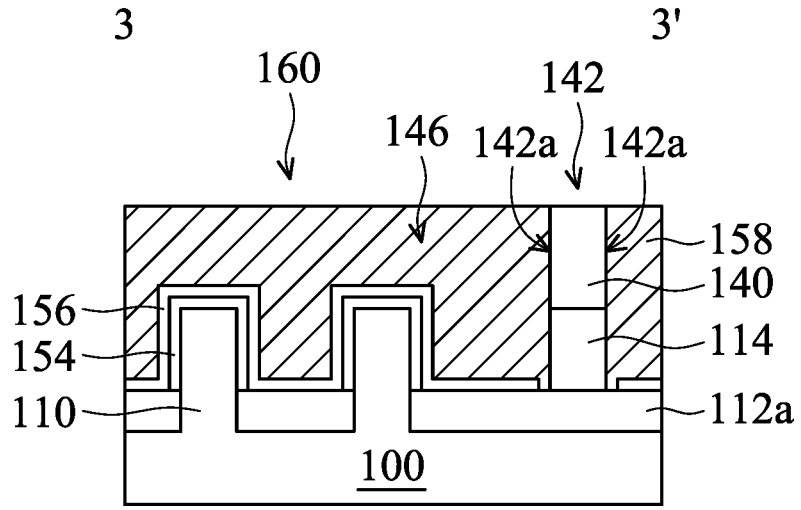
FIG. 3 is a schematic cross-sectional view showing various stages of the FinFET device structure taken along the line 3-3' in FIG. 1L.

After the sidewalls 130a and 142a with carbon-containing hydrophobic surfaces are formed, an active gate structure 160 is formed in the gate opening (i.e., the opening 146) with the hydrophobic surfaces (e.g., the carbon-containing hydrophobic surfaces), as shown in FIGS. 1L, 2 and 3 in accordance with some embodiments. FIGS. 2 and 3 are schematic cross-sectional views respectively showing the FinFET device structure taken along the lines 2-2' and 3-3' in FIG. 1L. The active gate structure 160 have first and second sidewalls opposite to each other and respectively facing and covered by the sidewalls 130a with hydrophobic surfaces, as shown in FIGS. 1L and 2. Moreover, the active gate structure 160 has a third sidewall adjoining the first and second sidewalls. The third sidewall of the active gate structure 160 faces and is covered by the sidewall 142a with the hydrophobic surface, as shown in FIGS. 1L and 3.

In some embodiments, the active gate structure 160 at least includes a gate dielectric layer 156 and a gate electrode layer 158 over the gate dielectric layer 156. More specifically, the gate dielectric layer 156 is formed over the insulating layer 136 and covers the exposed fin structures 110 and the exposed isolation features 112a in the opening 146. In some embodiments, the gate dielectric layer 156 is made of a high k dielectric material, such as metal oxide. Examples of the high-k dielectric material may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the gate dielectric layer 156 may be formed by chemical vapor deposition (CVD), physical vapor deposition, (PVD), atomic layer deposition (ALD), or another applicable process.

In some embodiments, since the sidewalls 130a and 142a have hydrophobic surfaces (e.g., carbon-containing hydrophobic surfaces), the gate dielectric layer 156 made of high-k dielectric material is difficult to form thereon. In those cases, the gate dielectric layer 156 is spaced apart from the hydrophobic surfaces of the sidewalls 130a and 142a, so that gaps may be formed between the gate dielectric layer 156 and the sidewalls 130a and between the gate dielectric layer 156 and the sidewalls 142a, as shown in FIGS. 2 and 3. Those gaps may be filled with the subsequent formed layers over the gate dielectric layer 156.

In some other embodiments, the gate dielectric layer 156 still covers the sidewalls 130a and 142a having hydrophobic surfaces. In those cases, however, the portion of the gate dielectric layer 156 covering the sidewalls 130a and 142a is thinner than the case where the sidewalls 130a and 142a without hydrophobic surfaces. The thickness difference between the cases with and without hydrophobic surfaces is in a range from about 2 Å to about 20 Å.

An interfacial layer 154 may be formed between each exposed fin structure 110 and the gate dielectric layer 156, so that the adhesion of the gate dielectric layer 156 can be improved. In some embodiments, the interfacial layer is made of $SiO_2$. In some embodiments, the interfacial layer 154 is formed by an atomic layer deposition (ALD) process, a thermal oxidation process, chemical vapor deposition (CVD) process, or another applicable process.

After the gate dielectric layer 156 is formed, a work functional metal layer (not shown) is formed over the insulating layer 136 and conformally covers the inner surface of the opening 146, in accordance with some embodiments. The work function metal layer is tuned to have a proper work function.

In some embodiments, the work function metal layer is made of an N-type work-function metal or a P-type work-function metal. N-type work-function metals include titanium (Ti), aluminum (Al), titanium aluminum alloy (TiAl), titanium aluminum nitride (TiAlN), titanium aluminum carbide (TiAlC), tantalum carbide (TaC), tantalum carbon nitride (TaCN), and combinations thereof. The P-work-function metal includes titanium nitride (TiN), tungsten nitride (WN), tantalum nitride (TaN), or a combination thereof. In some embodiments, the work function metal layer is formed by atomic layer deposition (ALD), sputtering, physical vapor deposition (PVD), or another applicable process.

In some other embodiments, a conformal capping or barrier layer (not shown) is formed over the gate dielectric layer 156 prior to formation of the work function metal layer, so that the capping or barrier layer is between gate dielectric layer 156 and the work function metal layer. The capping or barrier layer is employed to prevent the metal formed over it from penetrating into the channel region of the fin structure (e.g., the fin structure 110 in the opening 146) below the metal gate structure (e.g., the active gate structure 160).

In some embodiments, the capping or barrier layer is made of metal nitride. Examples of the metal nitride include TiN, TaN, and WN. The capping or barrier layer may be formed by physical vapor deposition, (PVD), atomic layer deposition (ALD), or another applicable process.

After the work functional metal layer is formed, a gate electrode layer 158 is formed over the insulating layer 136 and fills the opening 146 to cover the work functional metal layer, in accordance with some embodiments. In some embodiments, the gate electrode layer 158 is made of tungsten (W). In some embodiments, the gate electrode layer 158 is formed by chemical vapor deposition (CVD), high density plasma CVD (HDPCVD), metal organic CVD (MOCVD), plasma enhanced CVD (PECVD), or another applicable process.

In some other embodiments, a conformal blocking layer (not shown) is formed over the work functional metal layer prior to formation of the gate electrode layer 158, so that the blocking layer is between work functional metal layer and the gate electrode layer 158. The blocking layer is employed to prevent the byproduct formed during the gate electrode layer 158 deposition from diffusing toward the layers below. In some embodiments, the blocking layer is made of metal nitride. Examples of metal nitride include TiN, TaN, and WN. The blocking layer may be formed by physical vapor deposition, (PVD), atomic layer deposition (ALD), or another applicable process.

After the gate electrode layer 158 is formed, the gate electrode layer 158, the work function metal layer, and the gate dielectric layer 156 over the insulating layer 136 are successively removed, as shown in FIGS. 1L and 2 in accordance with some embodiments. For example, the gate electrode layer 158, the work function metal layer, and the gate dielectric layer 156 over the insulating layer 136 are successively removed by a chemical mechanical polishing (CMP) process to expose a top surface of the insulating layer 136. As a result, the active gate structure 160 is formed in the opening 146.

Many variations and/or modifications can be made to embodiments of the disclosure. For example, FIGS. 1A-1L show that the insulating gate-cut structure 142 have a multi-layer structure, but embodiments of the disclosure are not limited. The insulating gate-cut structure may be formed of a single insulating layer. FIGS. 4A to 4G show perspective representations of various stages of forming a FinFET device structure, in accordance with some embodiments. The stages shown in FIGS. 4A to 4G are similar to those shown in FIGS. 1A-1L. In some embodiments, the materials, formation methods, and/or benefits of the semiconductor device structure shown in FIGS. 1A-1L can also be applied in the embodiments illustrated in FIGS. 4A to 4G, and are therefore not repeated.

Figure 4A:
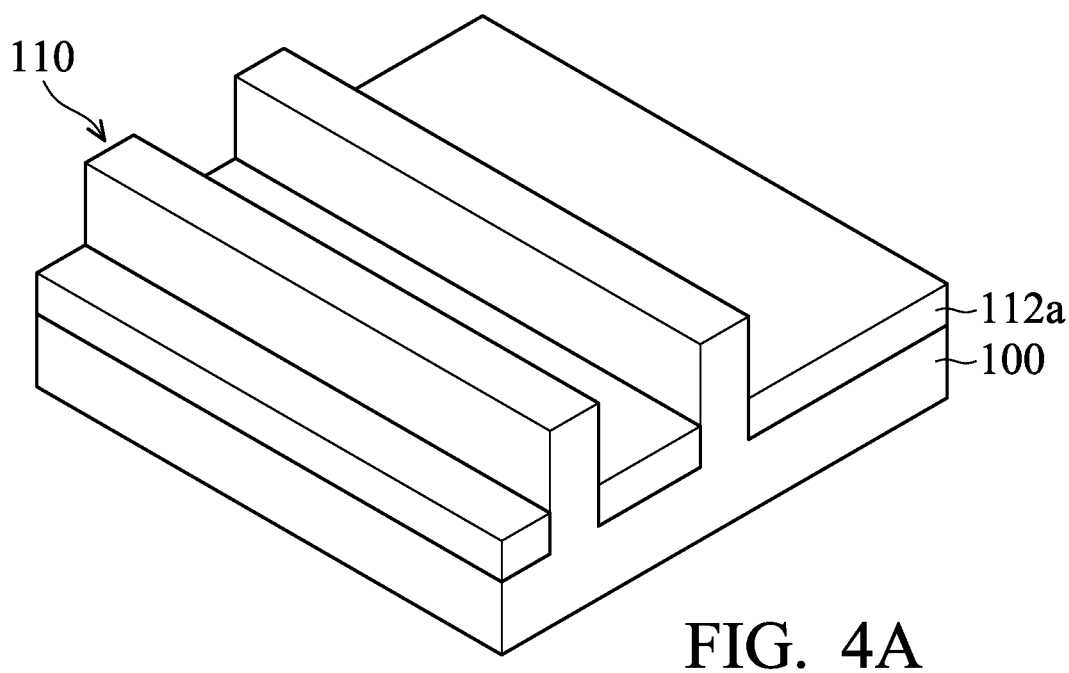
FIGS. 4A to 4G show perspective representations of various stages of forming a FinFET device structure, in accordance with some embodiments.

A structure similar to the structure shown in FIG. 1E is provided, as shown in FIG. 4A in accordance with some embodiments. Unlike the structure shown in FIG. 1E, there is not a dummy fin structure (e.g., the insulating layer 114 shown in FIG. 1E) formed over the isolation feature 124a.

Figure 4B:
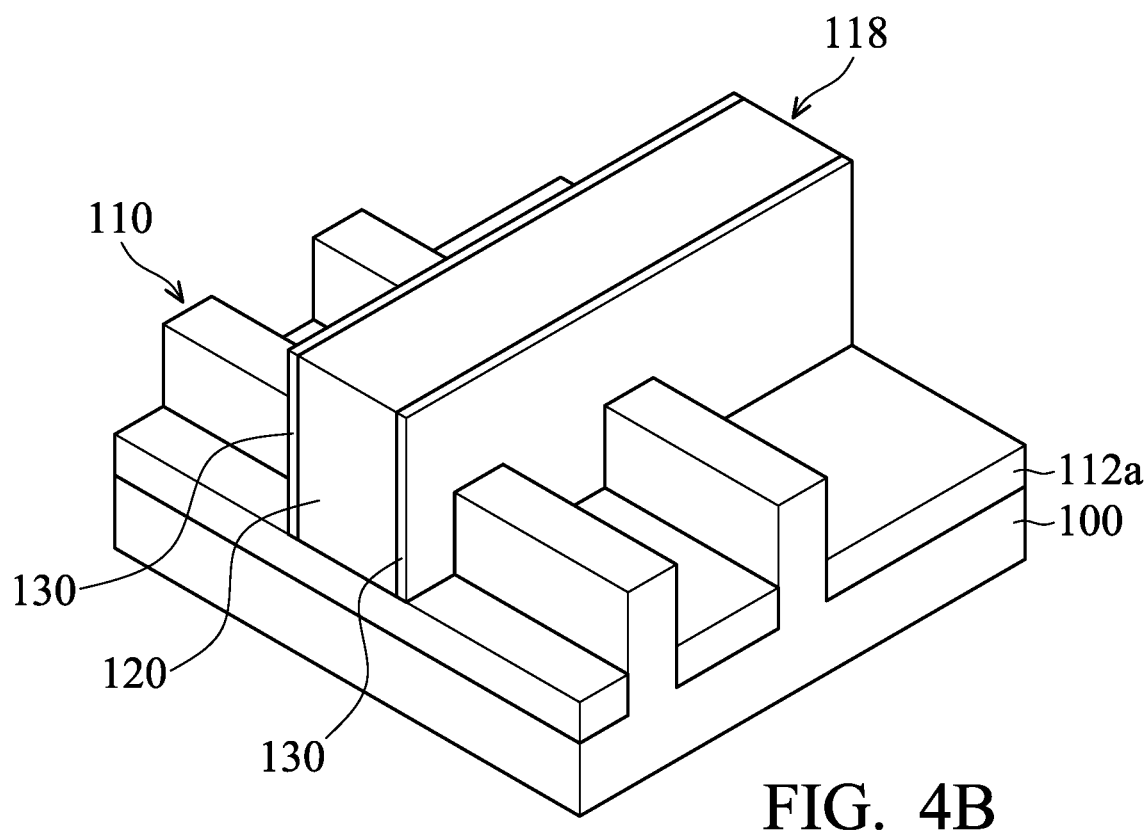

Like the structure shown in FIG. 1F, a dummy gate structure 118 is formed over the isolation features 112a and across the fin structures 110, as shown in FIG. 4B in accordance with some embodiments. In some embodiments, the dummy gate structure 118 includes an optional dummy gate dielectric layer (not shown) and a dummy gate electrode layer 120 over the dummy gate dielectric layer. After the dummy gate structure 118 is formed, two opposing spacer elements 130 are formed over opposite sidewall surfaces of the dummy gate structure 118.

Figure 4C:
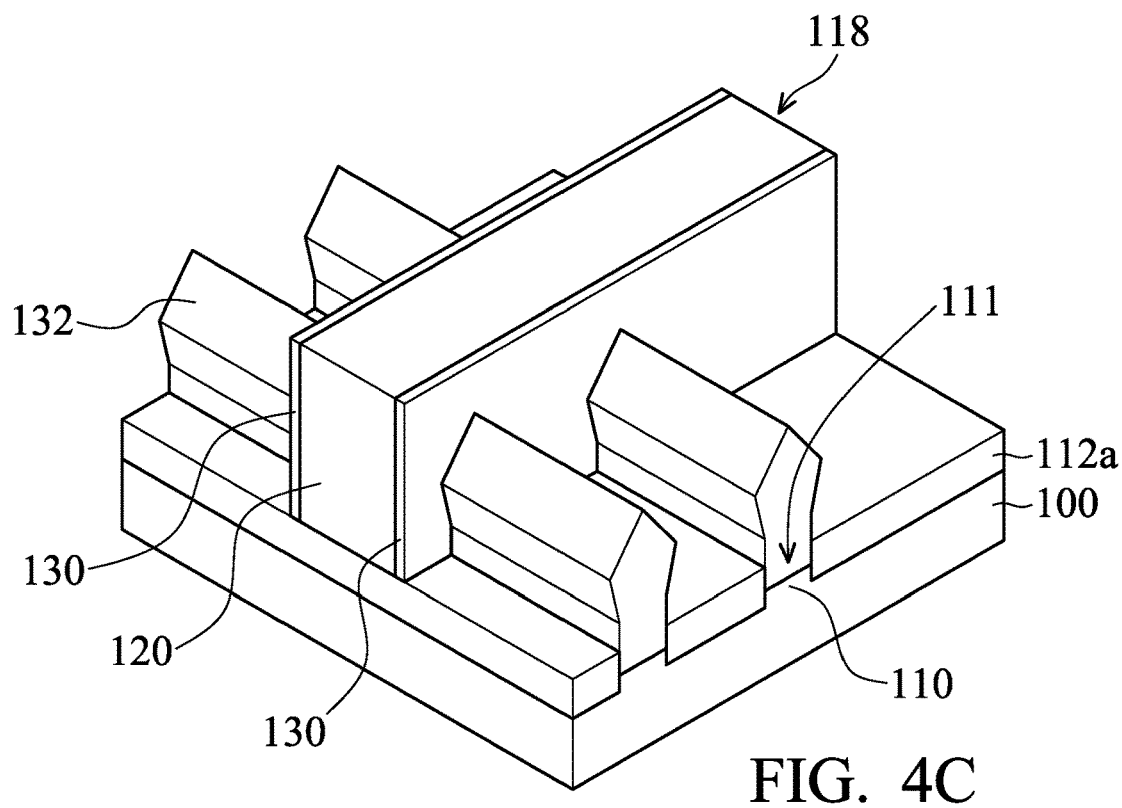

Like the structure shown in FIG. 1H, openings 111 are formed in each fin structure 110 and on opposing sidewall surfaces of the dummy gate structure 118. Afterward, source and drain features 132 are formed in the openings 111 and protrude from the openings 111, as shown in FIG. 4C in accordance with some embodiments. The source and drain features 132 are formed over the fin structure 110 on opposing sidewall surfaces of the dummy gate structure 118.

Afterwards, an insulating layer 136 is formed over the substrate 100 and covers the source and drain features 132 and the dummy gate structure 118, in accordance with some embodiments. In some other embodiments, a contact etch stop layer (not shown) is formed between the substrate 100 and the insulating layer 136.

Afterwards, a planarization process, such as a chemical mechanical polishing (CMP) process, is performed on the insulating layer 136 until the top surface of the dummy gate structure 118 is exposed, in accordance with some embodiments.

Figure 4D:
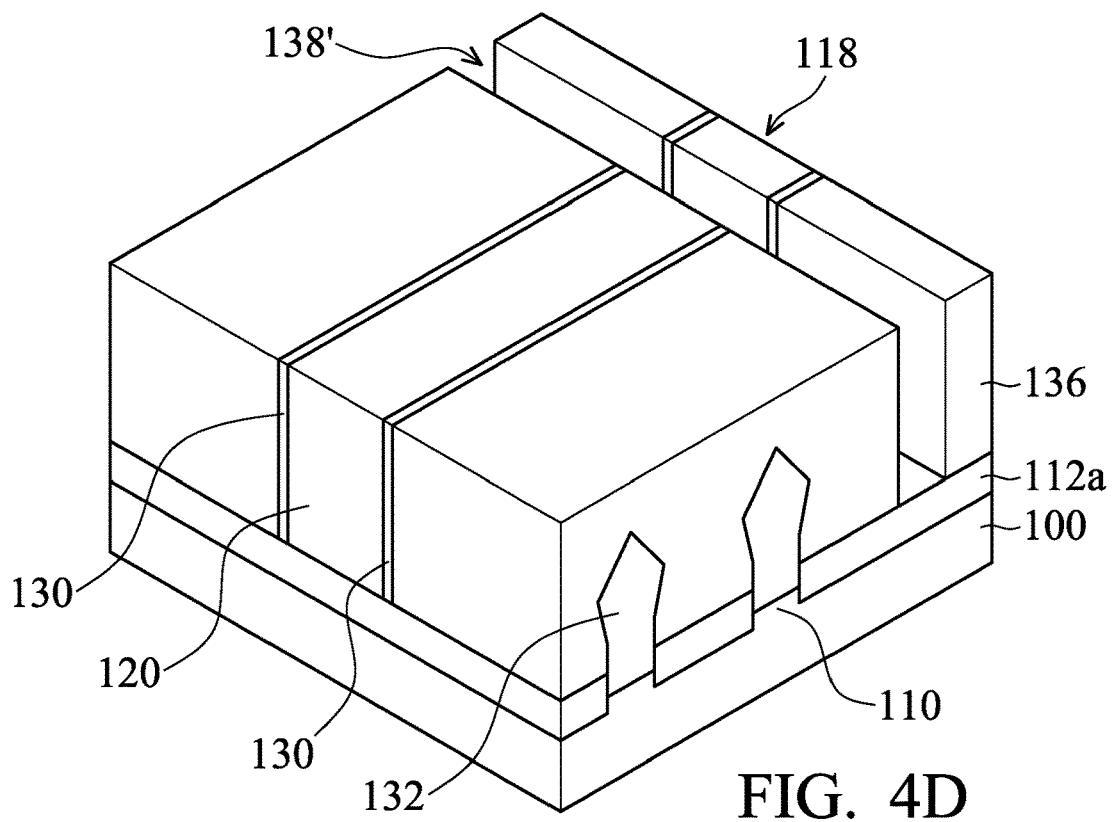

Like the structure shown in FIG. 1I, a cut opening 138' is formed to cut the dummy gate structure 118, as shown in FIG. 4D in accordance with some embodiments. Unlike the cut opening 138 shown in FIG. 1I, the cut opening 138' passes through the insulating layer 136 to expose the isolation feature 112a.

Figure 4E:
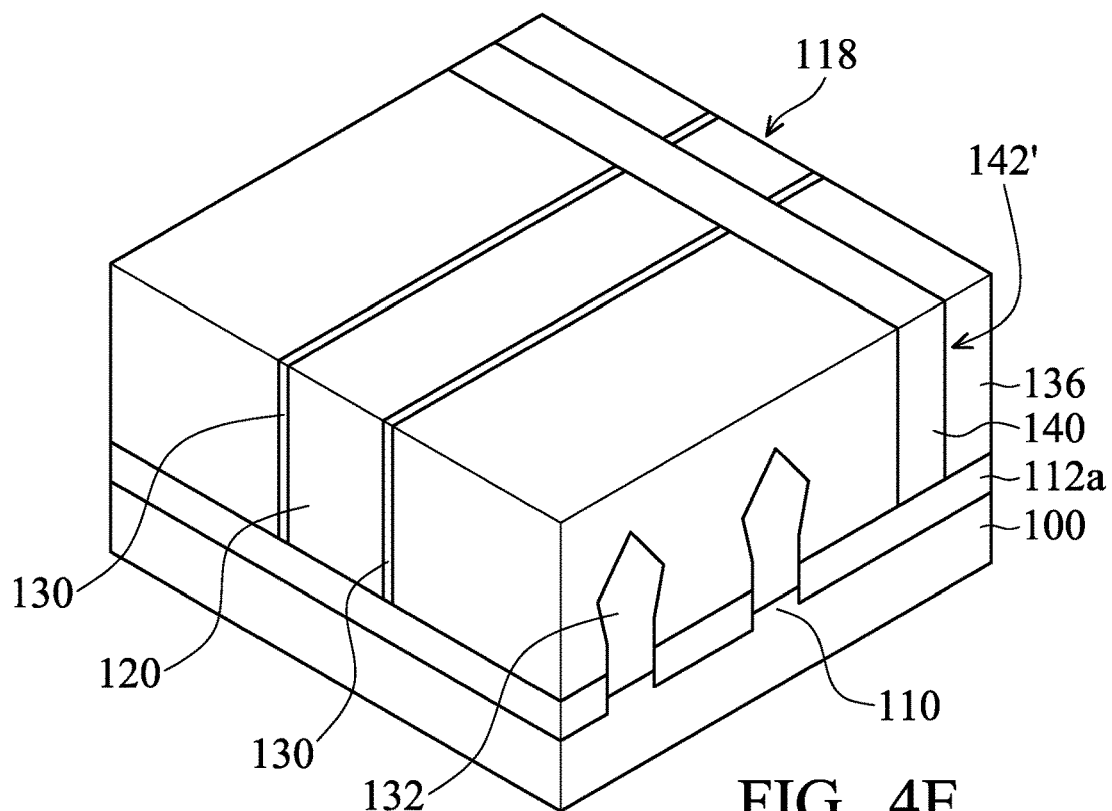

After the cut opening 138' is formed, an insulating gate-cut structure 142' is formed over the isolation feature 112a, as shown in FIG. 4E in accordance with some embodiments. In some embodiments, the cut opening 138' is filled with an insulating layer 140, so that the insulating layer 114 is over the exposed isolation feature 112a.

Figure 4F:
Figure 4F:
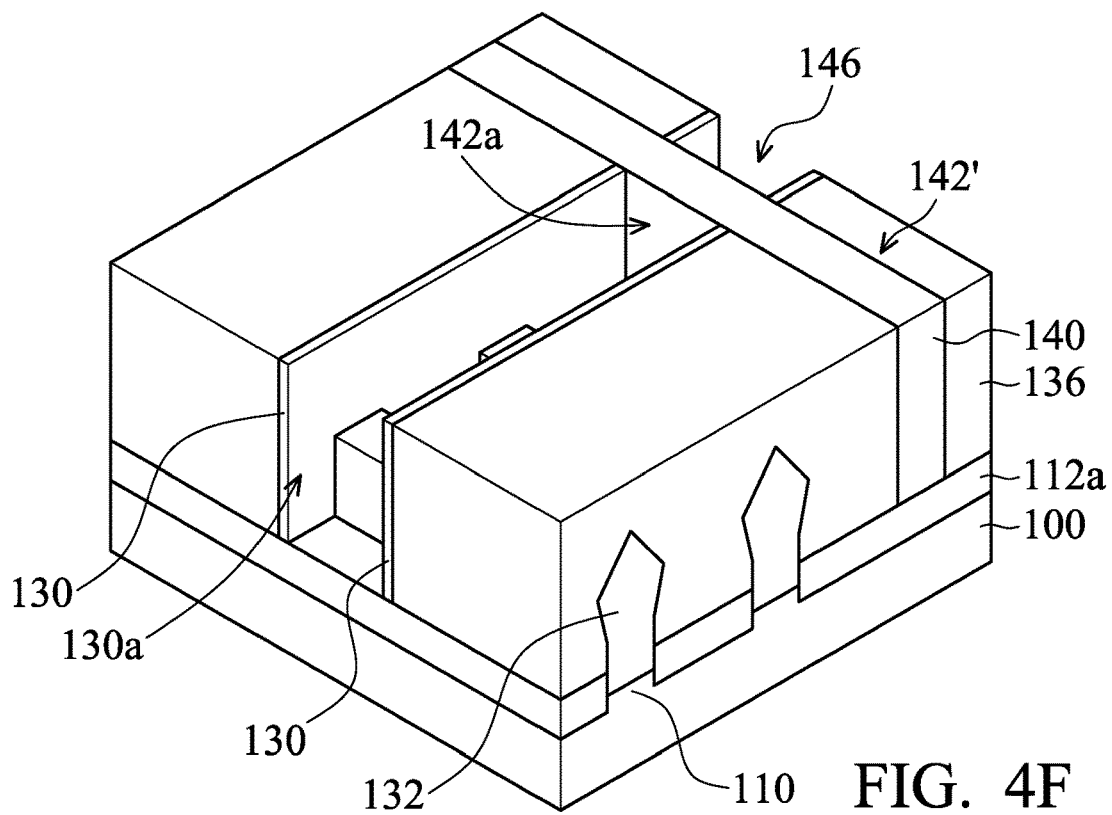

After the insulating gate-cut structure 142' is formed, the dummy gate structure 118 is removed to form an opening 146 in the insulating layer 136, as shown in FIG. 4F in accordance with some embodiments. Like the structure shown in FIG. 1K, a portion of the insulating gate-cut structure 142 is formed in the opening 146 to divide the opening 146 into two parts. Moreover, a portion of each fin structure 110 and a portion of the isolation feature 112a in the opening 146 are exposed.

Afterwards, a surface treatment 150 is performed on the inner sidewalls of the opening 146, in accordance with some embodiments. After the surface treatment 150 is performed, the sidewalls 130a and 142a have hydrophobic surfaces (e.g., carbon-containing process hydrophobic surfaces).

In some other embodiments, the surface treatment 150 is omitted. In those cases, the spacer elements 130 and the insulating gate-cut structure 142' (i.e., the insulating layer 140) are made of the same or similar material. In some embodiments, the spacer elements 130 are deposited by using a carbon-containing process gas, so that the sidewalls 130a have carbon-containing hydrophobic surfaces without performing the surface treatment 150. For example, the depositions of the spacer elements 130 and the insulating gate-cut structure 142' are performed using $C_3H_6$, $Si_2Cl_6$ (hexachloro disilane, HCD), $O_2$ and $N_2$ as the process gases. The flow rate of $C_3H_6$ is in a range from about 0.1 slm to about 30 slm, the flow rate of HCD is in a range from about 0.1 slm to about 20 slm, the flow rate of $O_2$ is in a range from about 0.1 slm to about 15 slm, and the flow rate of $N_2$ is in a range from about 1 slm to about 20 slm. Moreover, those depositions are performed at a temperature in a range from about 400° C. to about 700° C. and at a pressure in a range from about 50 pa to about 2000 pa.

Figure 4G:
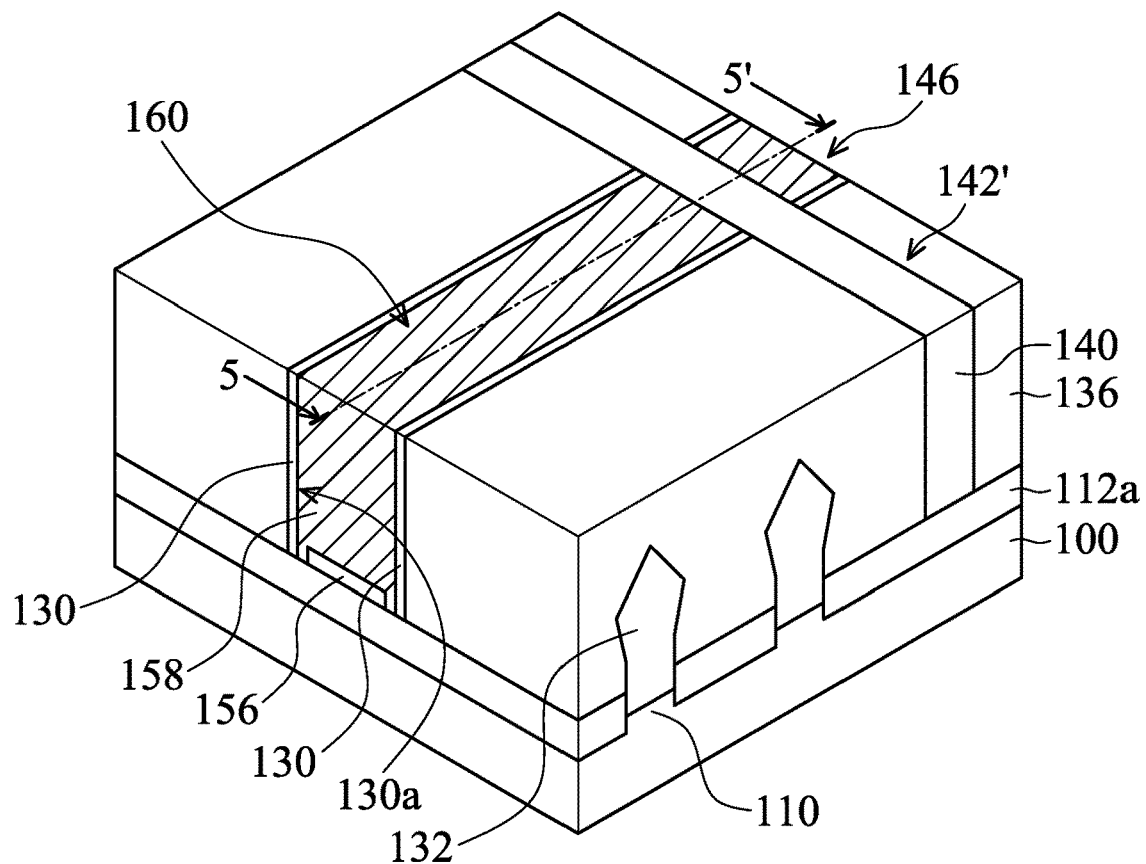
Figure 5:
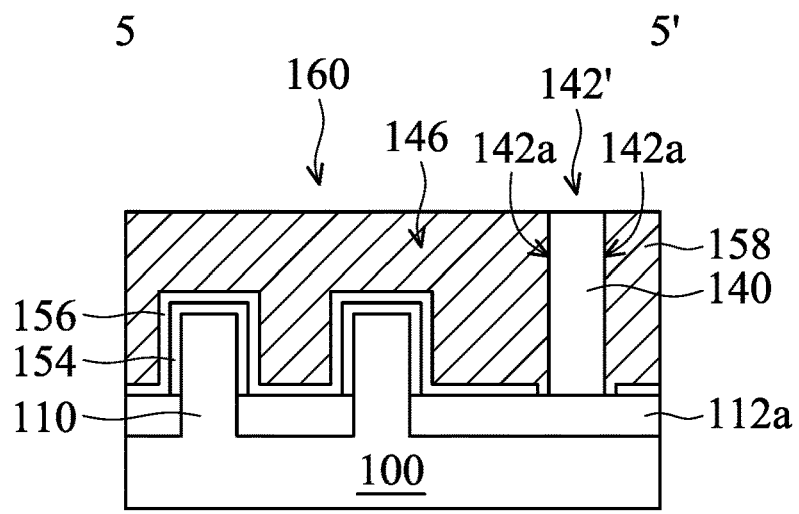
FIG. 5 is a schematic cross-sectional view showing various stages of the FinFET device structure taken along the line 5-5' in FIG. 4G.

After the sidewalls 130a and 142a with carbon-containing hydrophobic surfaces are formed, an active gate structure 160 is formed in the gate opening (i.e., the opening 146) with the hydrophobic surfaces (e.g., the carbon-containing hydrophobic surfaces), as shown in FIGS. 4G and 5 in accordance with some embodiments. FIG. 5 is a schematic cross-sectional view showing the FinFET device structure taken along the line 5-5' in FIG. 4G. In some embodiments, the active gate structure 160 at least includes a gate dielectric layer 156 and a gate electrode layer 158 over the gate dielectric layer 156. Like the structure shown in FIGS. 1L and 3, the gate dielectric layer 156 is spaced apart from the hydrophobic surfaces of the sidewalls 130a and 142a, so that gaps may be formed between the gate dielectric layer 156 and the sidewalls 130a and between the gate dielectric layer 156 and the sidewalls 142a, as shown in FIGS. 4G and 5. Those gaps may be filled with the subsequent formed layers over the gate dielectric layer 156. In some other embodiments, the gate dielectric layer 156 still covers the sidewalls 130a and 142a having hydrophobic surfaces. In those cases, however, the portion of the gate dielectric layer 156 covering the sidewalls 130a and 142a is thinner than the case where the sidewalls 130a and 142a without hydrophobic surfaces. The thickness difference between the cases with and without hydrophobic surfaces is in a range from about 1 Å to about 2 Å.

An interfacial layer 154 may be formed between each exposed fin structure 110 and the gate dielectric layer 156, as shown in FIG. 5 in accordance with some embodiments, so that the adhesion of the gate dielectric layer 156 can be improved. Afterwards, a work functional metal layer (not shown) is formed to conformally cover the inner surface of the opening 146, in accordance with some embodiments. In some other embodiments, a conformal capping or barrier layer (not shown) is formed over the gate dielectric layer 156 prior to formation of the work function metal layer, so that the capping or barrier layer is between gate dielectric layer 156 and the work function metal layer.

After the work functional metal layer is formed, a gate electrode layer 158 is formed to fill the opening 146 and cover the work functional metal layer, in accordance with some embodiments. In some other embodiments, a conformal blocking layer (not shown) is formed over the work functional metal layer prior to formation of the gate electrode layer 158, so that the blocking layer is between work functional metal layer and the gate electrode layer 158. After the gate electrode layer 158 is formed, the active gate structure 160 is completed.

Figure 6A:
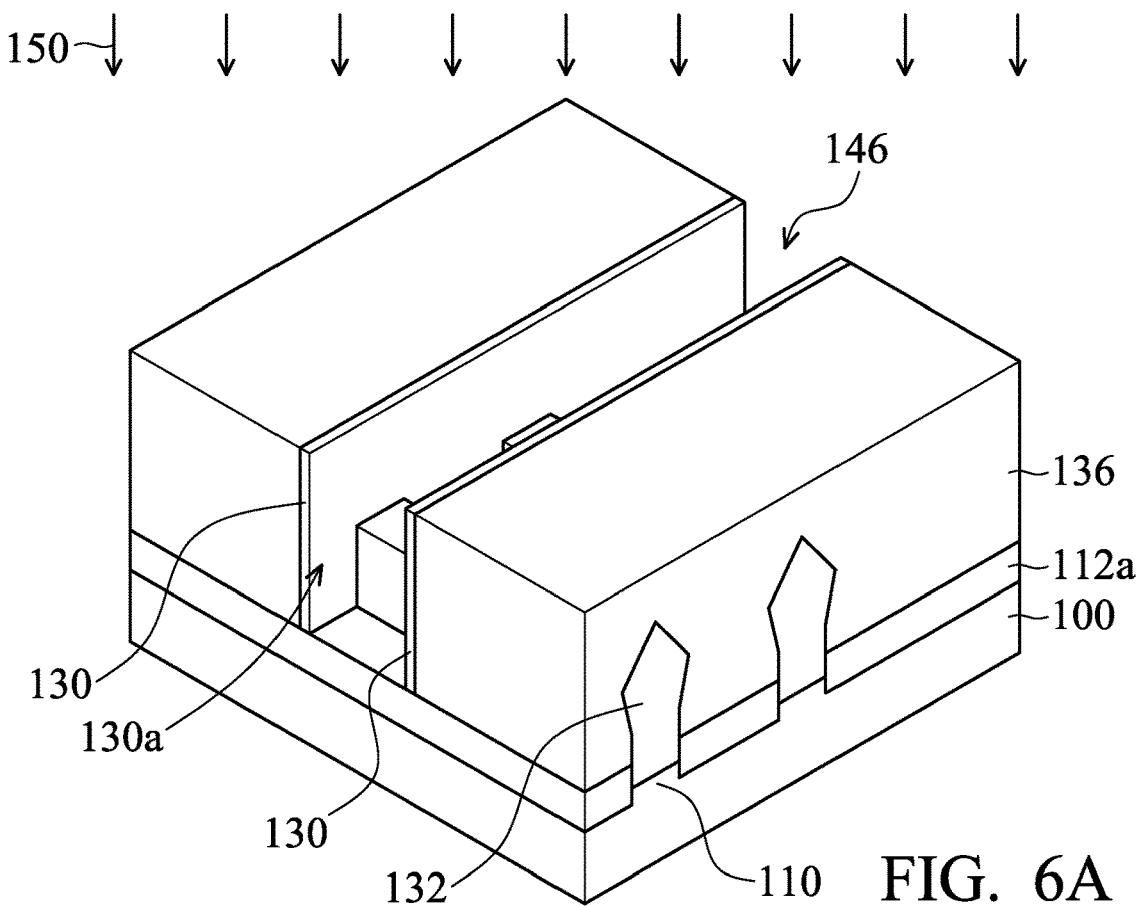
FIGS. 6A to 6C show perspective representations of various stages of forming a FinFET device structure, in accordance with some embodiments.
Figure 6B:
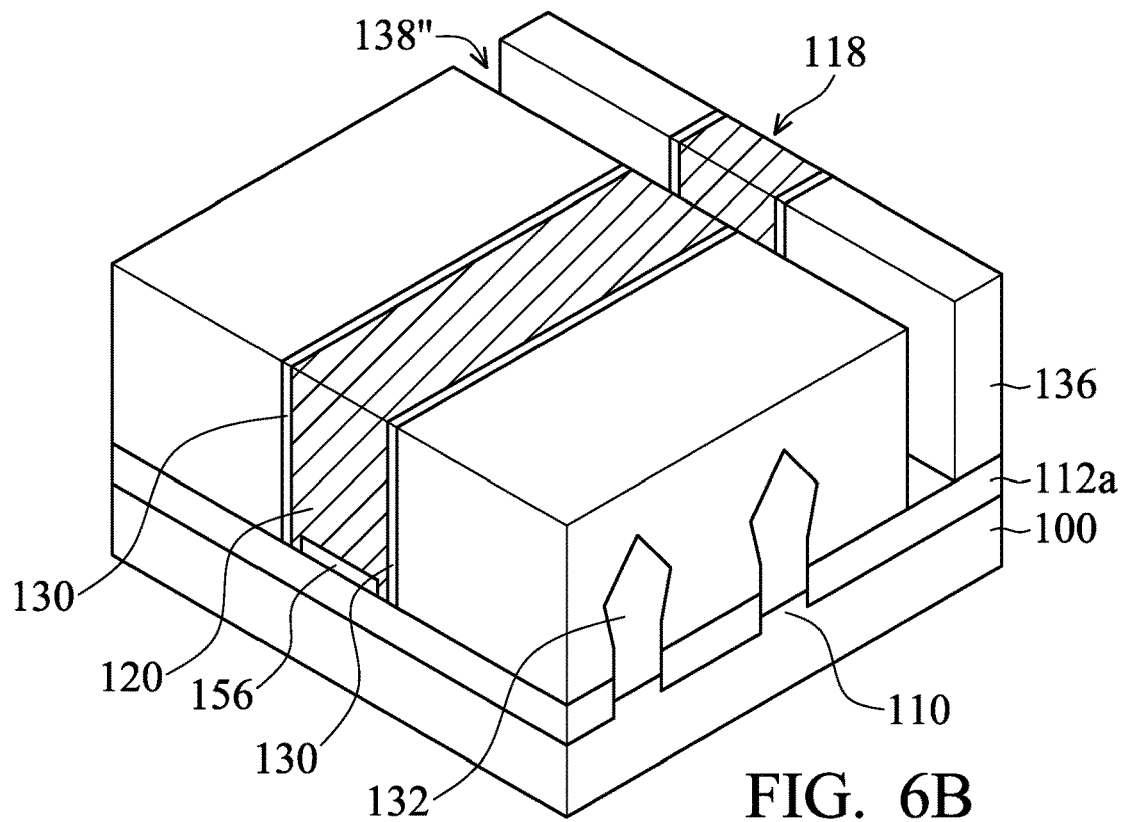
Figure 6C:
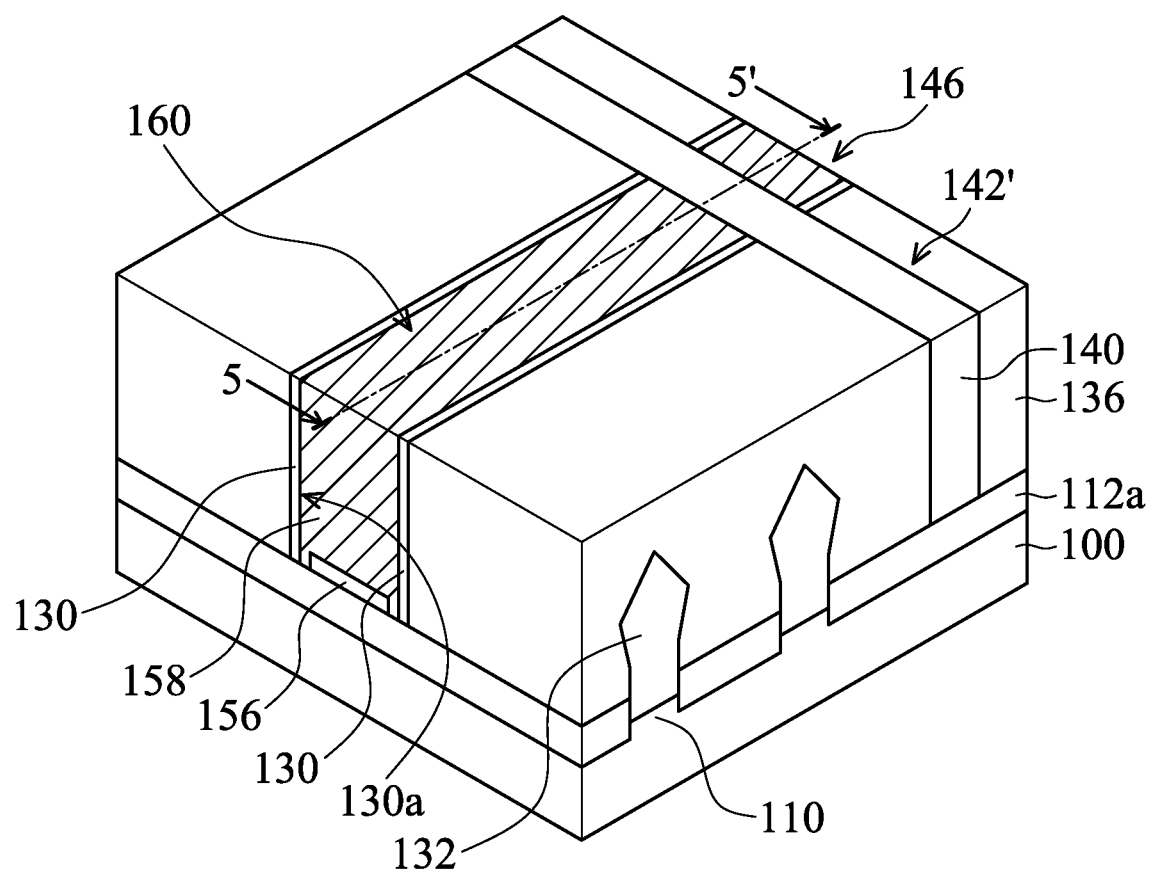

Many variations and/or modifications can be made to embodiments of the disclosure. For example, FIGS. 1A-1L and 4A-4G show that the insulating gate-cut structures 142 and 142' are formed prior to the formation of the gate structure 160, but embodiments of the disclosure are not limited. The insulating gate-cut structures 142 and 142' may be formed after the gate structure 160 is formed. FIGS. 6A to 6C show perspective representations of various stages of forming a FinFET device structure, in accordance with some embodiments. The stages shown in FIGS. 6A to 6C are similar to those shown in FIGS. 4A-4G. In some embodiments, the materials, formation methods, and/or benefits of the semiconductor device structure shown in FIGS. 4A-4G can also be applied in the embodiments illustrated in FIGS. 6A to 6C, and are therefore not repeated.

A structure similar to the structure shown in FIG. 4D is provided, in accordance with some embodiments. Unlike the structure shown in FIG. 4D, the cut opening 138' is not formed. Like the structure shown in FIG. 4F, the dummy gate structure 118 is removed to form an opening 146 in the insulating layer 136, as shown in FIG. 6A. Afterwards, a surface treatment 150 is performed on the inner sidewalls of the opening 146, in accordance with some embodiments. As a result, the sidewalls 130a have hydrophobic surfaces (e.g., carbon-containing process hydrophobic surfaces).

In some other embodiments, the surface treatment 150 is omitted. In those cases, the spacer elements 130 are deposited by using a carbon-containing process gas, so that the sidewalls 130a have carbon-containing hydrophobic surfaces without performing the surface treatment 150.

After the surface treatment 150 is performed, an active gate structure 160 is formed in the gate opening (i.e., the opening 146) with the hydrophobic surfaces (e.g., the carbon-containing hydrophobic surfaces), as shown in FIG. 6B in accordance with some embodiments. In some embodiments, the active gate structure 160 at least includes a gate dielectric layer 156 and a gate electrode layer 158 over the gate dielectric layer 156.

Afterwards, a cut opening 138" is formed to cut the active gate structure 160, in accordance with some embodiments. The cut opening 138" passes through the insulating layer 136 to expose the isolation feature 112a.

After the cut opening 138" is formed, an insulating gate-cut structure 142' is formed over the isolation feature 112a, as shown in FIG. 6C in accordance with some embodiments. In some embodiments, the cut opening 138" is filled with an insulating layer 140, so that the insulating layer 114 (i.e., the insulating gate-cut structure 142') is over the exposed isolation feature 112a. Since the gate structure 160 is formed prior to the formation of the insulating gate-cut structure 142', the gate dielectric layer 156 is not only spaced apart from the hydrophobic surfaces of the sidewalls 130a, but also spaced apart from the sidewalls of the insulating gate-cut structure 142' (as the sidewalls 142a of the insulating gate-cut structure 142' shown in FIG. 5).

Figure 7:
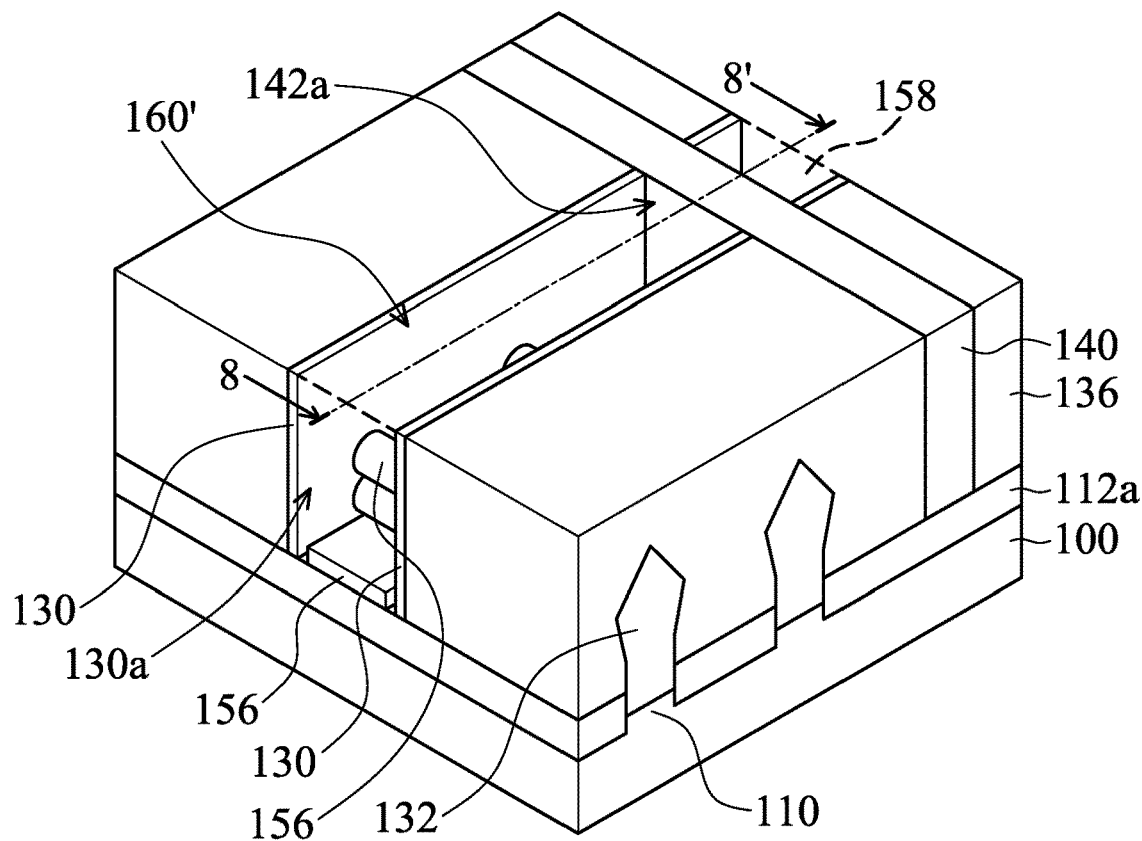
FIG. 7 shows a perspective representation of a gate-all-around field effect transistor (GAA FET) device structure, in accordance with some embodiments.
Figure 8:
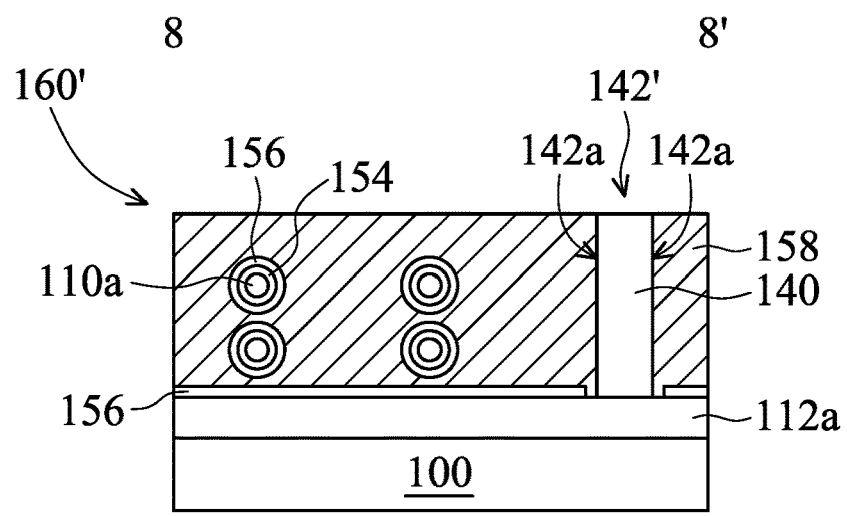
FIG. 8 is a schematic cross-sectional view showing various stages of the FinFET device structure taken along the line 8-8' in FIG. 7.

Many variations and/or modifications can be made to embodiments of the disclosure. For example, FIGS. 1L and 4G show that the fin structure 110 covered by the gate structure 158 protrudes from the substrate 100, but embodiments of the disclosure are not limited. A portion of the fin structure covered by the gate structure may be separated from the substrate by the gate structure. FIG. 7 shows a perspective representation of a gate-all-around field effect transistor (GAA FET) device structure, in accordance with some embodiments. FIG. 8 is a schematic cross-sectional view showing various stages of the FinFET device structure taken along the line 8-8' in FIG. 7. The semiconductor device structure shown in FIGS. 7 and 8 are similar to the semiconductor device structure shown in FIGS. 4G and 5, respectively. In some embodiments, the materials, formation methods, and/or benefits of the semiconductor device structure shown in FIGS. 4G and 5 can also be applied in the embodiments illustrated in FIGS. 7 and 8, and are therefore not repeated.

Unlike the semiconductor device structure shown in FIGS. 4G and 5, the semiconductor device includes fin structures 110 that include one or more wire portions 110a surrounded by the gate structure 160', in accordance with some embodiments. In some embodiments, the fin structure 110 includes two wire portions 110a vertically aligned to each other, as shown in FIG. 8.

In some embodiments, each wire portion 110a of the fin structure 110 is successively surrounded by an interfacial layer 154, the gate dielectric layer 156, and the gate electrode layer 158, so that the gate structure 160' has a gate-all-around (GAA) structure. Like the semiconductor device structure shown in FIG. 4G or 5, the semiconductor device structure includes an insulating gate-cut structure 142' with a single insulating layer (e.g., the insulating layer 140), as shown in FIG. 7 or 8 in accordance with some embodiments.

In some other embodiments, the insulating gate-cut structure 142' shown in FIGS. 7 and 8 can be replaced by the insulating gate-cut structure 142 shown in FIGS. 1L and 3, so that the semiconductor device structure has an insulating gate-cut structure with a multi-layer configuration (which includes the insulating layers 114 and 140).

Embodiments of a semiconductor device structure and a method for forming the same are provided. The semiconductor device structure includes an isolation feature formed over a semiconductor substrate. The semiconductor substrate includes a fin structure over the isolation feature. Two opposing spacer elements is formed over the isolation feature and across the fin structure so as to define a gate opening that exposes the fin structure and the isolation feature. The inner sidewalls of the gate opening is treated with a plasma or the spacer elements are formed by using a carbon-containing process gas, so that the inner sidewalls of the gate opening have hydrophobic surfaces. Afterwards, a gate structure that includes a gate dielectric layer and a gate electrode layer is formed in the gate opening with the hydrophobic surfaces. The hydrophobic surfaces of gate opening obstruct or slow down the formation of the gate dielectric layer thereon. As a result, the area between the spacer elements, which is a gate-filling window, is increased, and thus it is advantageous to perform the gap-filling process to fill gate materials into the gate opening.

In some embodiments, a method of forming a semiconductor device structure is provided. The method includes forming an isolation feature over a semiconductor substrate. The semiconductor substrate includes a fin structure over the isolation feature. The method also includes forming a first gate structure over the isolation feature and across the fin structure and forming spacer elements over sidewalls of the first gate structure. The method also includes removing the first gate structure, so as to form a gate opening that is defined by the spacer elements and exposes the fin structure and the isolation feature. The method also includes treating inner sidewalls of the gate opening with a plasma, so that the inner sidewalls of the gate opening have hydrophobic surfaces. The method also includes forming a second gate structure in the gate opening with the hydrophobic surfaces. The second gate structure includes a gate dielectric layer and a gate electrode layer over the gate dielectric layer.

In some embodiments, a method of forming a semiconductor device structure is provided. The method includes forming an isolation feature over a semiconductor substrate. The semiconductor substrate includes a fin structure over the isolation feature. The method also includes forming two opposing spacer elements over the isolation feature and across the fin structure so as to define a gate opening that exposes the fin structure and the isolation feature. Inner sidewalls of the gate opening have carbon-containing hydrophobic surfaces. The method also includes forming a gate structure in the gate opening with the carbon-containing hydrophobic surfaces.

In some embodiments, a semiconductor device structure is provided. The semiconductor device structure includes a fin structure formed over a semiconductor substrate and a gate structure formed over the fin structure. The semiconductor device structure also includes an isolation feature over a semiconductor substrate and below the gate structure. The semiconductor device structure also includes two spacer elements respectively formed over a first sidewall and a second sidewall of the gate structure. The first sidewall is opposite to the second sidewall and the two spacer elements have hydrophobic surfaces respectively facing the first sidewall and the second sidewall. The gate structure includes a gate dielectric layer and a gate electrode layer separating the gate dielectric layer from the hydrophobic surfaces of the two spacer elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device structure, comprising:
    forming an isolation feature over a semiconductor substrate, wherein the semiconductor substrate comprises a fin structure protruding from the isolation feature;
    forming a first gate structure over the isolation feature and across the fin structure;
    forming spacer elements over sidewalls of the first gate structure;
    removing the first gate structure, so as to form a gate opening that is defined by the spacer elements and expose the fin structure and the isolation feature;
    treating inner sidewalls of the gate opening with a plasma, so that the inner sidewalls of the gate opening have hydrophobic surfaces; and
    forming a second gate structure in the gate opening with the hydrophobic surfaces, wherein the second gate structure comprises a gate dielectric layer and a gate electrode layer over the gate dielectric layer.

2. The method as claimed in claim 1, wherein the plasma that is employed to treat the inner sidewalls of the gate opening is formed using a carbon-containing process gas.

3. The method as claimed in claim 1, further comprising forming an insulating gate-cut structure over the isolation feature in the gate opening prior to the removal of the first gate structure, wherein the insulating gate-cut structure comprises a first insulating layer formed after the first gate structure is formed.

4. The method as claimed in claim 3, wherein the insulating gate-cut structure further comprises a second insulating layer formed between the isolation feature and the first insulating layer, and wherein the second insulating layer is formed before the first gate structure is formed.

5. The method as claimed in claim 3, wherein two opposing sidewalls of the insulating gate-cut structure are treated with the plasma while treating the inner sidewalls of the gate opening, so that the two opposing sidewalls of the insulating gate-cut structure have hydrophobic surfaces.

6. The method as claimed in claim 5, wherein the gate dielectric layer is spaced apart from the hydrophobic surfaces of the inner sidewalls of the gate opening and the hydrophobic surfaces of the two opposing sidewalls of the insulating gate-cut structure.

7. The method as claimed in claim 1, wherein the fin structure is surrounded by the second gate structure, so that the second gate structure has a gate-all-around structure.

8. A method of forming a semiconductor device structure, comprising:
    forming an isolation feature over a semiconductor substrate, wherein the semiconductor substrate comprises a fin structure protruding from the isolation feature;
    forming two opposing spacer elements over the isolation feature and across the fin structure so as to define a gate opening that exposes the fin structure and the isolation feature, wherein inner sidewalls of the gate opening have carbon-containing hydrophobic surfaces; and
    forming a gate structure in the gate opening with the carbon-containing hydrophobic surfaces.

9. The method as claimed in claim 8, wherein the formation of the two spacer elements comprises treating the inner sidewalls of the gate opening with a carbon-containing plasma, so as to form the carbon-containing hydrophobic surfaces.

10. The method as claimed in claim 8, wherein the two spacer elements are formed by using a carbon-containing process gas, so as to form the carbon-containing hydrophobic surfaces of the inner sidewalls of the gate opening.

11. The method as claimed in claim 8, further comprising forming an insulating gate-cut structure over the isolation feature in the gate opening and spaced apart from the fin structure, wherein the insulating gate-cut structure comprises a first insulating layer having a top surface substantially level with top surfaces of the two opposing spacer elements.

12. The method as claimed in claim 11, wherein the insulating gate-cut structure further comprises a second insulating layer between the isolation feature and the first insulating layer.

13. The method as claimed in claim 11, further comprising treating two opposing sidewalls of the insulating gate-cut structure with a carbon-containing plasma, so that the two opposing sidewalls of the insulating gate-cut structure have carbon-containing hydrophobic surfaces.

14. The method as claimed in claim 13, wherein the gate structure comprises a gate dielectric layer and a gate electrode layer separating the gate dielectric layer from the carbon-containing hydrophobic surfaces of the inner sidewalls of the gate opening and the carbon-containing hydrophobic surfaces of the two opposing sidewalls of the insulating gate-cut structure.

15. The method as claimed in claim 14, wherein the fin structure is surrounded by the gate electrode layer, so that the gate structure has a gate-all-around structure.

16. A method of forming a semiconductor device structure, comprising:

forming a fin structure over a semiconductor substrate;

forming two opposing spacer elements over the semiconductor substrate and across the fin structure;

forming an insulating gate-cut structure over the semiconductor substrate, passing through the spacer elements, and spaced apart from the fin structure; and forming a gate structure in a space over the semiconductor substrate and defined by the spacer elements and the insulating gate-cut structure, wherein the gate structure comprises a gate dielectric layer and a gate electrode layer over the gate dielectric layer, and wherein the gate dielectric layer is separated from sidewalls of the spacer elements and the insulating gate-cut structure that face the gate structure by the gate electrode layer.

17. The method as claimed in claim 16, further comprising treating the sidewalls of the spacer elements and the insulating gate-cut structure that face the gate structure with a carbon-containing plasma prior to formation of the gate structure, so that the sidewalls of the spacer elements and the insulating gate-cut structure have carbon-containing hydrophobic surfaces.

18. The method as claimed in claim 16, wherein the sidewalls of the spacer elements and the insulating gate-cut structure that face the gate structure have carbon-containing hydrophobic surfaces.

19. The method as claimed in claim 16, wherein the insulating gate-cut structure comprises:

a first insulating layer having a top surface substantially level with top surfaces of the two opposing spacer elements; and a second insulating layer between the semiconductor substrate and the first insulating layer.

20. The method as claimed in claim 16, wherein the fin structure is surrounded by the gate structure, so that the gate structure has a gate-all-around structure.

* * * * *